(12) United States Patent
Kim

(10) Patent No.: US 10,902,894 B2
(45) Date of Patent: Jan. 26, 2021

(54) SEMICONDUCTOR DEVICES

(71) Applicant: SK hynix Inc., Icheon-si (KR)

(72) Inventor: Woongrae Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 40 days.

(21) Appl. No.: 16/219,194

(22) Filed: Dec. 13, 2018

(65) Prior Publication Data

US 2020/0082854 A1    Mar. 12, 2020

(30) Foreign Application Priority Data

Sep. 6, 2018  (KR) .................. 10-2018-0106651

(51) Int. Cl.
| | | |
|---|---|---|
| G11C 8/00 | (2006.01) | |
| G11C 7/12 | (2006.01) | |
| G11C 7/10 | (2006.01) | |
| G11C 8/12 | (2006.01) | |
| G11C 7/18 | (2006.01) | |
| G11C 11/34 | (2006.01) | |

(52) U.S. Cl.
CPC ............... *G11C 7/12* (2013.01); *G11C 7/106* (2013.01); *G11C 7/109* (2013.01); *G11C 7/1009* (2013.01); *G11C 7/1063* (2013.01); *G11C 7/1087* (2013.01); *G11C 7/18* (2013.01); *G11C 8/12* (2013.01); *G11C 11/34* (2013.01)

(58) Field of Classification Search
CPC ... G11C 7/1063; G11C 7/1009; G11C 7/1087; G11C 11/4076; G11C 11/408; G11C 7/222; G11C 11/4096; G11C 7/109
USPC ....................................... 365/230.03, 230.06
See application file for complete search history.

(56) References Cited

U.S. PATENT DOCUMENTS

| | | | | | |
|---|---|---|---|---|---|
| 6,157,990 | A * | 12/2000 | Randolph | ........... | G06F 12/0893 365/230.03 |
| 6,401,167 | B1 * | 6/2002 | Barth | .................. | G11C 7/1006 365/203 |
| 6,418,067 | B1 * | 7/2002 | Watanabe | ........... | G11C 11/4076 365/200 |
| 9,190,127 | B2 * | 11/2015 | Jang | ........................ | G11C 7/12 |
| 9,281,033 | B2 * | 3/2016 | Ko | ............................. | G11C 7/24 |
| 9,373,379 | B2 * | 6/2016 | Hong | ....................... | G11C 8/18 |
| 9,570,125 | B1 * | 2/2017 | Gajapathy | ............ | G11C 7/1084 |
| 9,659,611 | B1 * | 5/2017 | Lee | ........................ | G11C 7/1072 |
| 10,545,822 | B2 * | 1/2020 | Kwak | ................... | G11C 7/1009 |
| 10,593,386 | B2 * | 3/2020 | Kim | ..................... | G11C 7/1069 |
| 10,614,871 | B2 * | 4/2020 | Kang | .................. | G11C 11/4087 |
| 10,629,248 | B2 * | 4/2020 | Kim | ..................... | G11C 11/4087 |
| 10,671,319 | B2 * | 6/2020 | Shin | ...................... | G06F 3/0673 |

(Continued)

FOREIGN PATENT DOCUMENTS

KR         101735091 B1     5/2017

*Primary Examiner* — Viet Q Nguyen
(74) *Attorney, Agent, or Firm* — William Park & Associates Ltd.

(57) ABSTRACT

A semiconductor device includes a column control circuit and a core circuit. The column control circuit generates a read column signal and a write column signal from a read bank address signal and a write bank address signal in response to a read latch pulse and a write latch pulse, which are generated during a masked write operation. The core circuit is configured to include a plurality of banks. Any one of the plurality of banks is activated by the read column signal and the write column signal to perform an internal read operation and a write operation.

20 Claims, 15 Drawing Sheets

(56) References Cited

U.S. PATENT DOCUMENTS

| | | | | |
|---|---|---|---|---|
| 10,679,682 B2* | 6/2020 | Kim | ................... | G11C 7/22 |
| 10,699,759 B2* | 6/2020 | Kim | ................... | G11C 11/4076 |
| 2006/0117155 A1* | 6/2006 | Ware | ................... | G11C 8/06 |
| | | | | 711/163 |
| 2014/0334238 A1* | 11/2014 | Ware | ................... | G11C 7/1039 |
| | | | | 365/189.14 |
| 2015/0302907 A1* | 10/2015 | Hadrick | ................... | G11C 7/1042 |
| | | | | 365/189.05 |
| 2016/0342539 A1 | 11/2016 | Bains | | |
| 2019/0325929 A1* | 10/2019 | Kim | ................... | G11C 8/18 |
| 2020/0020372 A1* | 1/2020 | Kim | ................... | G11C 8/12 |
| 2020/0135248 A1* | 4/2020 | Kim | ................... | G11C 8/12 |

* cited by examiner

SEMICONDUCTOR DEVICES

CROSS-REFERENCE TO RELATED APPLICATIONS

The present application claims priority under 35 U.S.C 119(a) to Korean Application No. 10-2018-0106651, filed on Sep. 6, 2018, which is incorporated herein by reference in its entirety.

BACKGROUND

1. Technical Field

Embodiments of the present disclosure relate to semiconductor devices performing a masked write operation.

2. Related Art

In general, semiconductor devices, such as dynamic random access memory (DRAM) devices, may include a plurality of bank groups including cell arrays which are selected by addresses. Each of the bank groups may be realized to include a plurality of banks. The semiconductor device may select any one of the plurality of bank groups and may perform a column operation for outputting data stored in a cell array included in the selected bank group through input/output (I/O) lines.

SUMMARY

According to an embodiment, a semiconductor device includes a column control circuit and a core circuit. The column control circuit generates a read column signal and a write column signal from a read bank address signal and a write bank address signal in response to a read latch pulse and a write latch pulse which are generated during a masked write operation. The core circuit is configured to include a plurality of banks. Any one of the plurality of banks is activated by the read column signal and the write column signal to perform an internal read operation and a write operation.

According to another embodiment, a semiconductor device includes a bank control circuit, a signal synthesis circuit and a column signal generation circuit. The bank control circuit is configured to generate first and second read latch address signals or first and second internal read latch address signals from first and second read bank address signals in response to first and second read latch pulses. Moreover, the bank control circuit is configured to generate first and second write latch address signals or first and second internal write latch address signals from first and second write bank address signals in response to first and second write latch pulses. The signal synthesis circuit is configured to generate a read synthesis signal by synthesizing first and second read pulses which are sequentially enabled during an internal read operation of a masked write operation. In addition, the signal synthesis circuit is configured to generate a write synthesis signal by synthesizing first and second write pulses which are sequentially enabled during a write operation of the masked write operation. The column signal generation circuit is configured to output the first and second read latch address signals or the first and second internal read latch address signals as first and second read column signals in response to the read synthesis signal. Furthermore, the column signal generation circuit is configured to output the first and second write latch address signals or the first and second internal write latch address signals as first and second write column signals in response to the write synthesis signal.

DETAILED DESCRIPTION OF THE EMBODIMENTS

Various embodiments of the present disclosure are described below with reference to the accompanying drawings. The described embodiments are for illustrative purposes only and are not intended to limit the scope of the present disclosure.

Semiconductor devices may provide a bank group mode to include an 8-bank mode and a 16-bank mode. A bank group may include a plurality of banks. For example, a bank group may include four banks. In the bank group mode, a column operation for one bank included in the bank group may be performed by one command. In the 8-bank mode, column operations for two banks respectively included in separate bank groups are sequentially performed by one command. In the 16-bank mode, column operations for four banks respectively included in separate bank groups are sequentially performed by one command.

Figure 1:
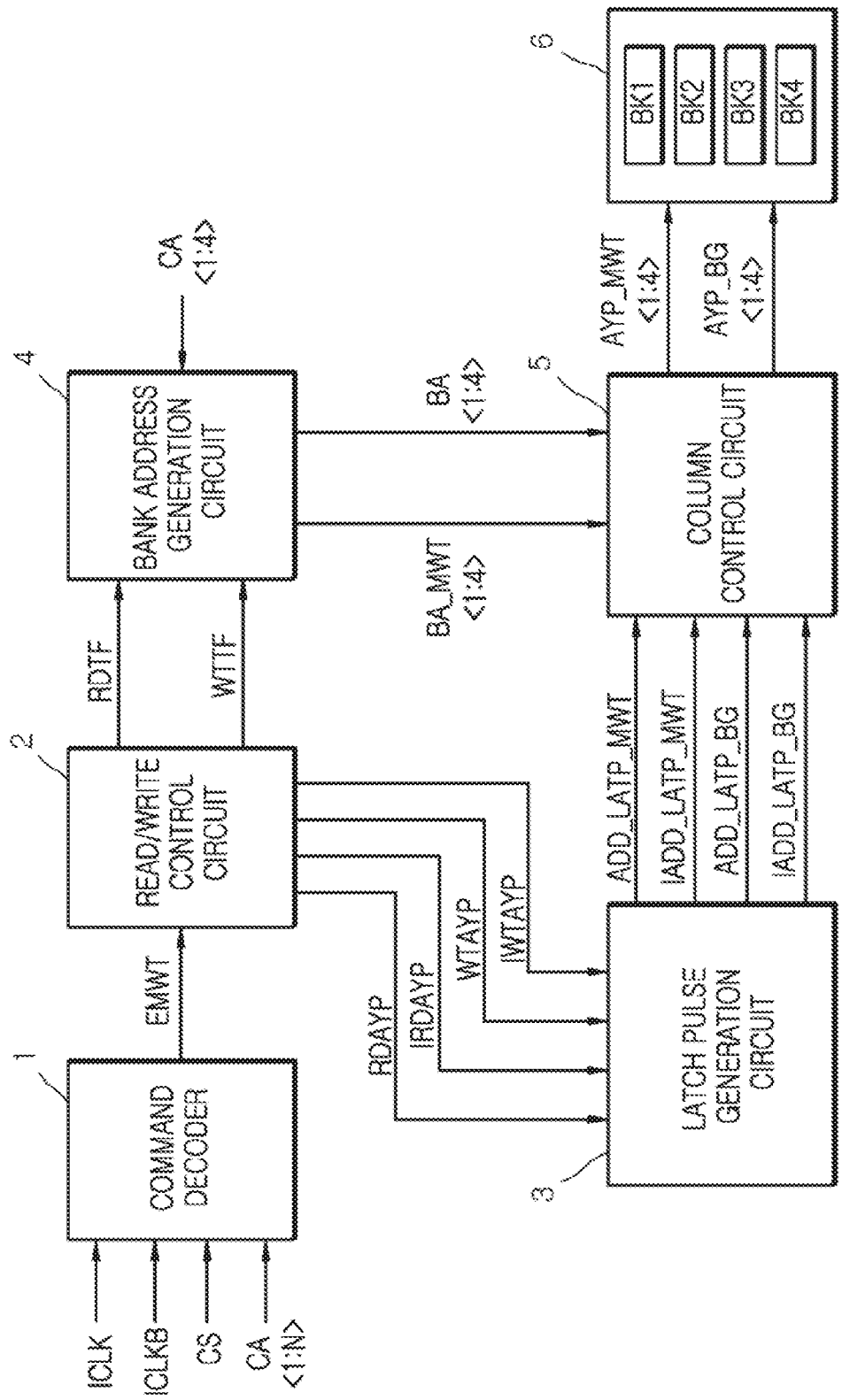
FIG. 1 shows a block diagram illustrating a configuration of a semiconductor device, according to an embodiment of the present disclosure.

As illustrated in FIG. 1, a semiconductor device, according to an embodiment, may include a command decoder 1, a read/write control circuit 2, a latch pulse generation circuit 3, a bank address generation circuit 4, a column control circuit 5, and a core circuit 6.

The command decoder 1 may be synchronized with an internal clock signal ICLK and an inverted internal clock signal ICLKB to generate a masked write signal EMWT in response to a chip selection signal CS if the command/address signal CA<1:N> has a logic level combination for performing a masked write operation. The command decoder 1 may decode the command/address signal CA<1:N> in synchronization with the internal clock signal ICLK and the inverted internal clock signal ICLKB to generate the masked write signal EMWT in response to the chip selection signal CS. A logic level combination of the command/address signal CA<1:N> for generating the masked write signal EMWT may be set differently for different embodiments. The masked write operation means an operation including an internal read operation and a write operation, which are sequentially performed by one command. The number of bits included in the command/address signal CA<1:N> may be different for different embodiments. The command/address signal CA<1:N> may include bits for generating the masked write signal EMWT, bits for generating first to fourth (i.e., first, second, third, and fourth) read bank address signals BA_MWT<1:4>, and bits for generating first to fourth write bank address signals BA<1:4>.

The read/write control circuit 2 may generate a read control signal RDTF and a write control signal WTTF, which are sequentially enabled in response to the masked write signal EMWT. The read/write control circuit 2 may generate the write control signal WTTF after a time for performing the internal read operation elapses from a point in time when the read control signal RDTF is generated. The internal read operation and the write operation may be performed with a burst length of 32. For the burst length, '32' means that 32-bit data are inputted to or outputted from the core circuit 6 by a single operation performed with one write command or one read command. The burst length of the internal read operation and the write operation may be set to be "4," "8," "16," or the like, according to the embodiments.

The read/write control circuit 2 may generate a first read pulse RDAYP and a second read pulse IRDAYP, which are sequentially enabled in response to the masked write signal EMWT. The read/write control circuit 2 may generate the second read pulse IRDAYP after a time for performing the internal read operation elapses from a point in time when the first read pulse RDAYP is generated in response to the masked write signal EMWT.

The read/write control circuit 2 may generate a first write pulse WTAYP and a second write pulse IWTAYP, which are sequentially enabled in response to the masked write signal EMWT. The read/write control circuit 2 may generate the second write pulse IWTAYP after a time for performing the write operation elapses from a point in time when the first write pulse WTAYP is generated in response to the masked write signal EMWT.

The latch pulse generation circuit 3 may latch the first read pulse RDAYP and the second read pulse IRDAYP and may delay the latched pulses of the first and second read pulses RDAYP and IRDAYP by a predetermined period to generate a first read latch pulse ADD_LATP_MWT and a second read latch pulse IADD_LATP_MWT. The word "predetermined" as used herein with respect to a parameter, such as a predetermined period, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

The latch pulse generation circuit 3 may latch the first write pulse WTAYP and the second write pulse IWTAYP and may delay the latched pulses of the first and second write pulses WTAYP and IWTAYP by a predetermined period to generate a first write latch pulse ADD_LATP_BG and a second write latch pulse IADD_LATP_BG.

The bank address generation circuit 4 may generate the first to fourth read bank address signals BA_MWT<1:4> from the first to fourth command/address signals CA<1:4> in response to the read control signal RDTF. The bank address generation circuit 4 may latch the first to fourth command/address signals CA<1:4> to output the latched signals of the first to fourth command/address signals CA<1:4> as the first to fourth read bank address signals BA_MWT<1:4> if the read control signal RDTF is enabled.

The bank address generation circuit 4 may generate the first to fourth write bank address signals BA<1:4> from the first to fourth command/address signals CA<1:4> in response to the write control signal WTTF. The bank address generation circuit 4 may latch the first to fourth command/address signals CA<1:4> to output the latched signals of the first to fourth command/address signals CA<1:4> as the first to fourth write bank address signals BA<1:4> if the write control signal WTTF is enabled.

The column control circuit 5 may generate first to fourth read column signals AYP_MWT<1:4> from the first to fourth read bank address signals BA_MWT<1:4> in response to the first read latch pulse ADD_LATP_MWT and the second read latch pulse IADD_LATP_MWT. The column control circuit 5 may generate the first to fourth read column signals AYP_MWT<1:4> from the first to fourth read bank address signals BA_MWT<1:4> if the first read latch pulse ADD_LATP_MWT is enabled. The column control circuit 5 may generate the first to fourth read column signals AYP_MWT<1:4> from the first to fourth read bank address signals BA_MWT<1:4> if the second read latch pulse IADD_LATP_MWT is enabled.

The column control circuit 5 may generate first to fourth write column signals AYP_BG<1:4> from the first to fourth write bank address signals BA<1:4> in response to the first write latch pulse ADD_LATP_BG and the second write latch pulse IADD_LATP_BG. The column control circuit 5 may generate the first to fourth write column signals AYP_BG<1:4> from the first to fourth write bank address signals BA<1:4> if the first write latch pulse ADD_LATP_BG is enabled. The column control circuit 5 may generate the first to fourth write column signals AYP_BG<1:4> from the first to fourth write bank address signals BA<1:4> if the second write latch pulse IADD_LATP_BG is enabled.

The core circuit 6 may include first to fourth banks BK1~BK4. As used herein, the tilde "~" indicates a range of components. For example, "BK1~BK4" indicates the first BK1, second BK2, third BK3, and fourth BK4 banks shown in FIG. 1. The core circuit 6 may activate one of the first to fourth banks BK1~BK4 in response to the first to fourth read column signals AYP_MWT<1:4> to perform the internal read operation. If the first read column signal AYP_MWT<1> is enabled, then the first bank BK1 may be activated to perform the internal read operation. If the second read column signal AYP_MWT<2> is enabled, then the second bank BK2 may be activated to perform the internal read operation. If the third read column signal AYP_MWT<3> is enabled, then the third bank BK3 may be activated to perform the internal read operation. If the fourth read column signal AYP_MWT<4> is enabled, then the fourth bank BK4 may be activated to perform the internal read operation.

The core circuit 6 may activate one of the first to fourth banks BK1~BK4 in response to the first to fourth write column signals AYP_BG<1:4> to perform the write operation. If the first write column signal AYP_BG<1> is enabled, then the first bank BK1 may be activated to perform the write operation. If the second write column signal AYP_BG<2> is enabled, then the second bank BK2 may be activated to perform the write operation. If the third write column signal AYP_BG<3> is enabled, then the third bank BK3 may be activated to perform the write operation. If the fourth write column signal AYP_BG<4> is enabled, then the fourth bank BK4 may be activated to perform the write operation.

Although the core circuit 6 is configured to include the first to fourth banks BK1~BK4, the number of banks included in the core circuit 6 may be different for different embodiments. Two or more banks in the core circuit 6 may constitute one bank group.

Figure 2:
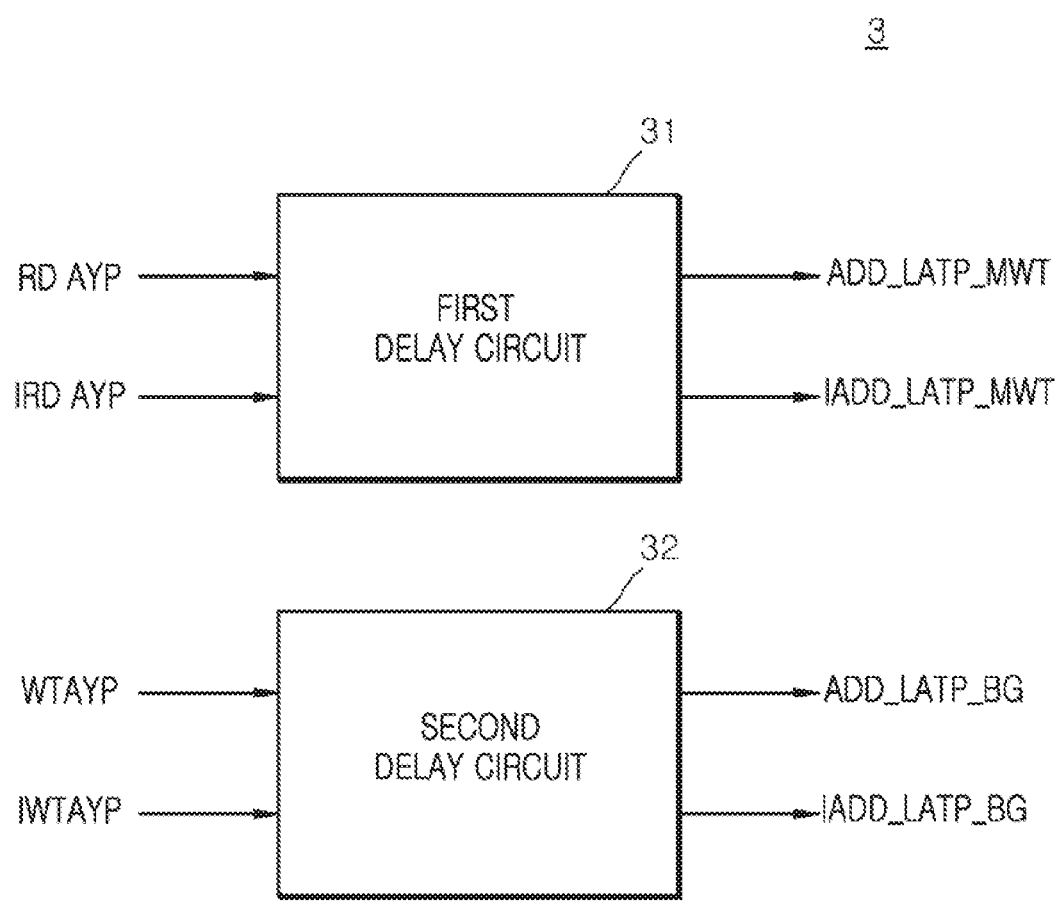
FIG. 2 shows a block diagram illustrating a configuration of a latch pulse generation circuit included in the semiconductor device of FIG. 1.

Referring to FIG. 2, the latch pulse generation circuit 3 may include a first delay circuit 31 and a second delay circuit 32.

The first delay circuit 31 may latch the first read pulse RDAYP, and the second read pulse IRDAYP and may delay the latched pulses of the first and second read pulses RDAYP and IRDAYP by a predetermined period to generate the first read latch pulse ADD_LATP_MWT and the second read latch pulse IADD_LATP_MWT. The first delay circuit 31 may latch the first read pulse RDAYP and may delay the latched pulse of the first read pulse RDAYP by a predetermined period to generate the first read latch pulse ADD_LATP_MWT. The first delay circuit 31 may latch the second read pulse IRDAYP and may delay the latched pulse of the second read pulse IRDAYP by a predetermined period to generate the second read latch pulse IADD_LATP_MWT. The predetermined period corresponding to a delay time of the first delay circuit 31 may be set differently in different embodiments.

The second delay circuit 32 may latch the first write pulse WTAYP and the second write pulse IWTAYP and may delay the latched pulses of the first and second write pulses WTAYP and IWTAYP by a predetermined period to generate the first write latch pulse ADD_LATP_BG and the second write latch pulse IADD_LATP_BG. The second delay circuit 32 may latch the first write pulse WTAYP and may delay the latched pulse of the first write pulse WTAYP by a predetermined period to generate the first write latch pulse ADD_LATP_BG. The second delay circuit 32 may latch the second write pulse IWTAYP and may delay the latched pulse of the second write pulse IWTAYP by a predetermined period to generate the second write latch pulse IADD_LATP_BG. The predetermined period corresponding to a delay time of the second delay circuit 32 may be set differently for different embodiments.

Figure 3:
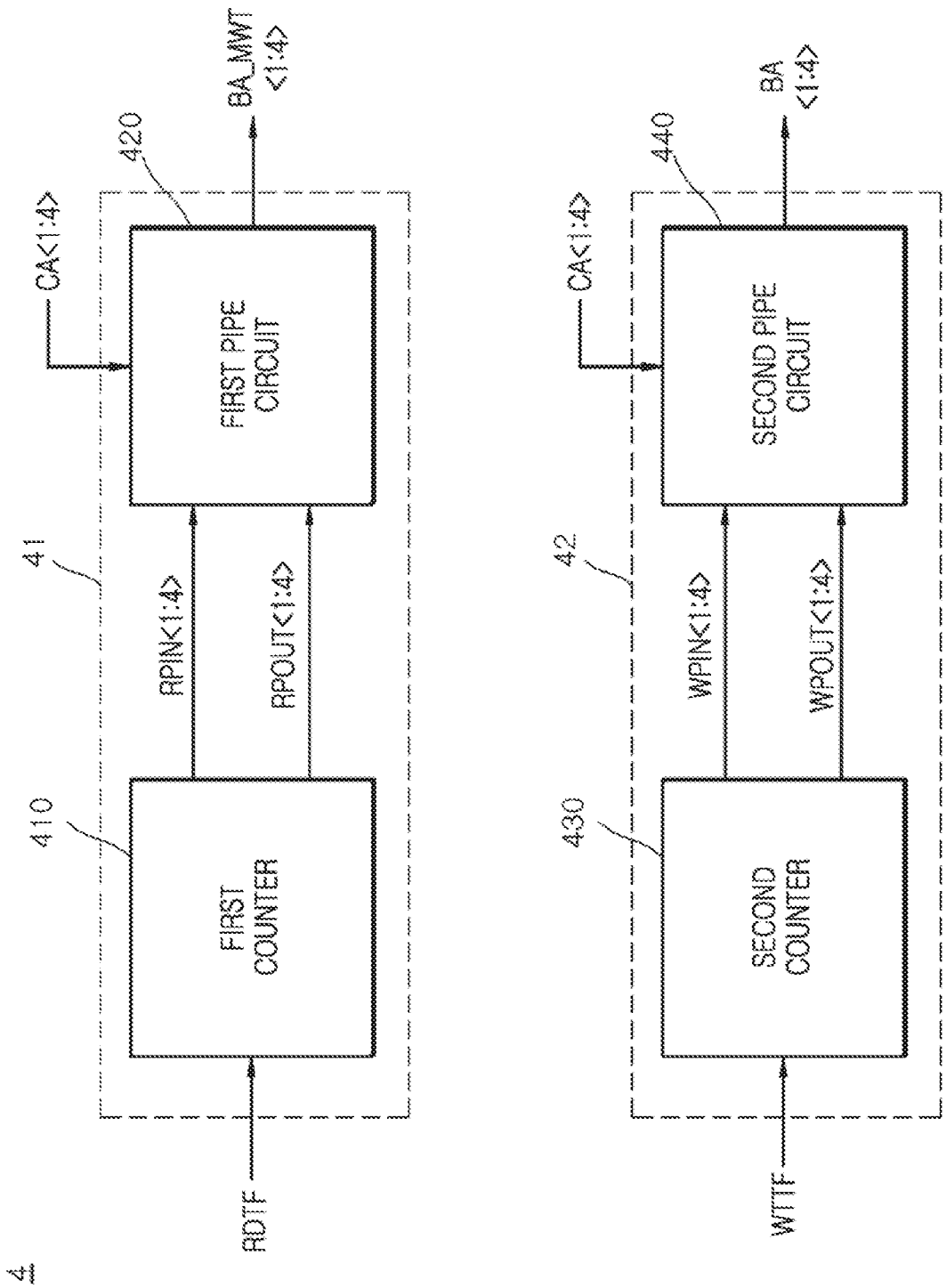
FIG. 3 shows a block diagram illustrating a configuration of a bank address generation circuit included in the semiconductor device of FIG. 1.

Referring to FIG. 3, the bank address generation circuit 4 may include a read bank address generation circuit 41 and a write bank address generation circuit 42.

The read bank address generation circuit 41 may include a first counter 410 and a first pipe circuit 420.

The first counter 410 may generate first to fourth read input signals RPIN<1:4> and first to fourth read output signals RPOUT<1:4>, which are sequentially counted in response to the read control signal RDTF. The first counter 410 may generate the first to fourth read input signals RPIN<1:4> and the first to fourth read output signals RPOUT<1:4>, which are sequentially counted if the read control signal RDTF is enabled.

The first pipe circuit 420 may latch the first to fourth command/address signals CA<1:4> in response to the first to fourth read input signals RPIN<1:4>. The first pipe circuit 420 may output the latched signals of the first to fourth command/address signals CA<1:4> as the first to fourth read bank address signals BA_MWT<1:4> in response to the first to fourth read output signals RPOUT<1:4>.

As described above, the read bank address generation circuit 41 may generate the first to fourth read bank address signals BA_MWT<1:4> from the first to fourth command/address signals CA<1:4> in response to the read control signal RDTF.

The write bank address generation circuit 42 may include a second counter 430 and a second pipe circuit 440.

The second counter 430 may generate first to fourth write input signals WPIN<1:4> and first to fourth write output signals WPOUT<1:4>, which are sequentially counted in response to the write control signal WTTF. The second counter 430 may generate the first to fourth write input signals WPIN<1:4> and the first to fourth write output signals WPOUT<1:4>, which are sequentially counted if the write control signal WTTF is enabled.

The second pipe circuit 440 may latch the first to fourth command/address signals CA<1:4> in response to the first to fourth write input signals WPIN<1:4>. The second pipe circuit 440 may output the latched signals of the first to fourth command/address signals CA<1:4> as the first to fourth write bank address signals BA<1:4> in response to the first to fourth write output signals WPOUT<1:4>.

As described above, the write bank address generation circuit 42 may generate the first to fourth write bank address signals BA<1:4> from the first to fourth command/address signals CA<1:4> in response to the write control signal WTTF.

Figure 4:
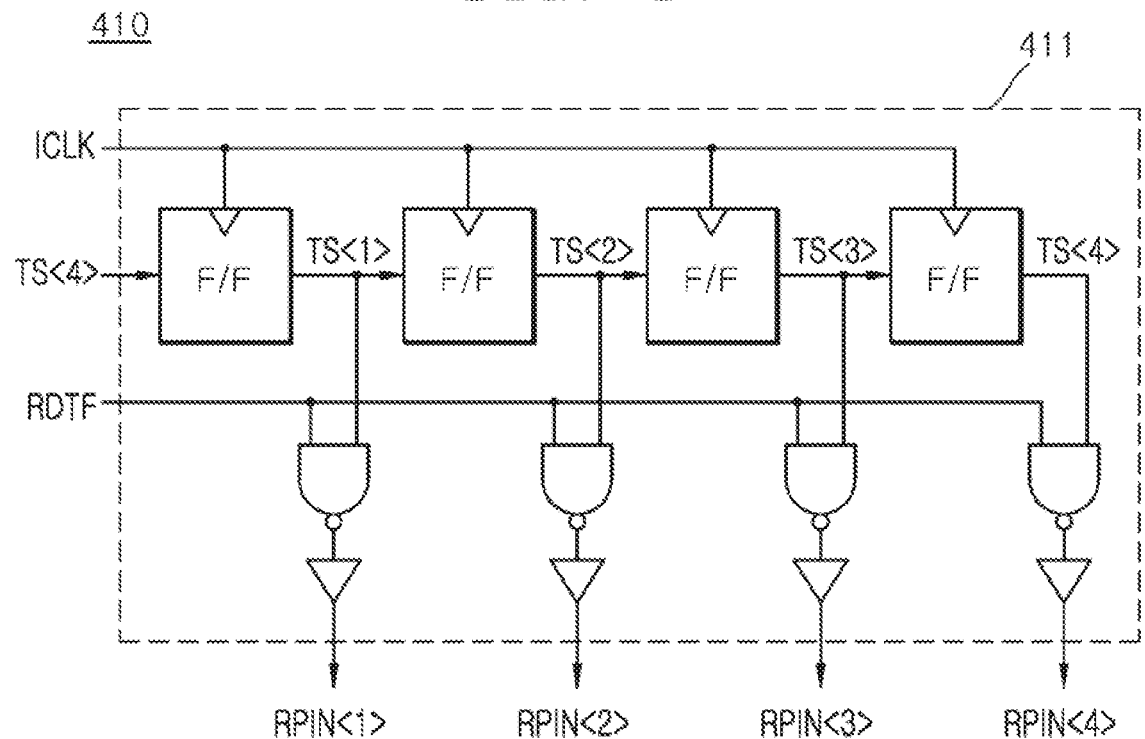
FIG. 4 shows a circuit diagram illustrating a configuration of a first counter included in the bank address generation circuit of FIG. 3.
Figure 4:
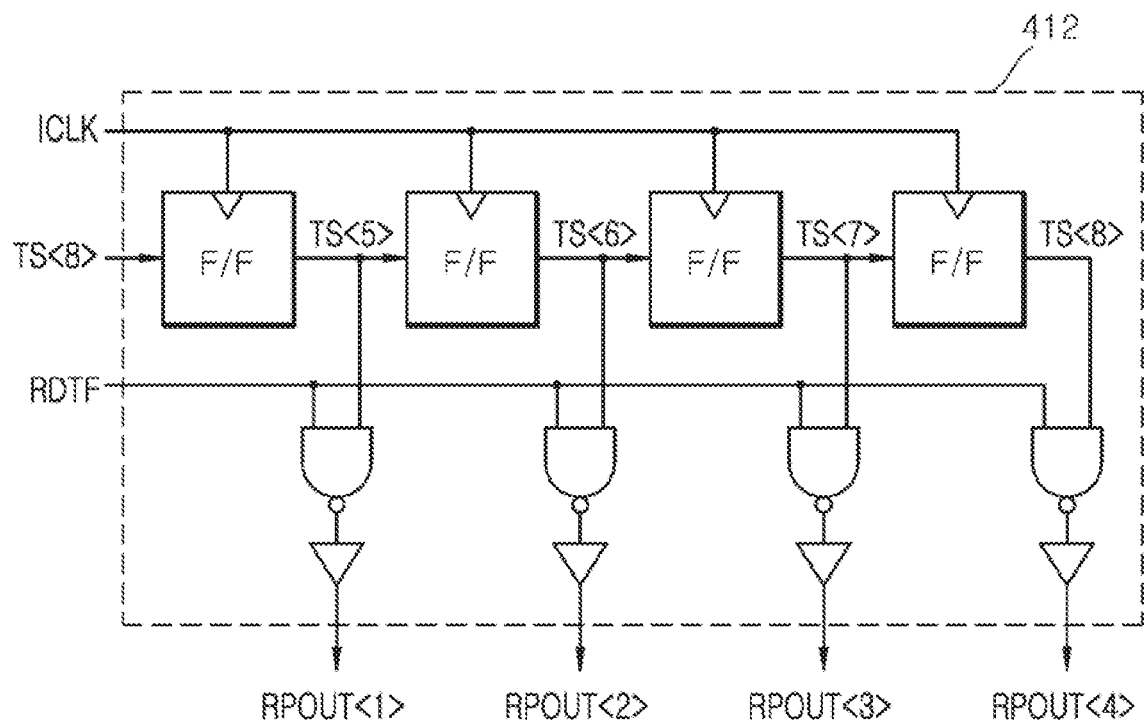

Referring to FIG. 4, the first counter 410 may include a read input signal generation circuit 411 and a read output signal generation circuit 412.

The read input signal generation circuit 411 may generate first to fourth transmission signals TS<1:4>, which are sequentially enabled in response to the read control signal RDTF. The read input signal generation circuit 411 may output the first to fourth transmission signals TS<1:4> sequentially enabled while the read control signal RDTF is enabled as the first to fourth read input signals RPIN<1:4>.

The read output signal generation circuit 412 may generate fifth to eighth transmission signals TS<5:8>, which are sequentially enabled in response to the read control signal RDTF. The read output signal generation circuit 412 may output the fifth to eighth transmission signals TS<5:8>, sequentially enabled while the read control signal RDTF is enabled as the first to fourth read output signals RPOUT<1:4>.

Figure 5:
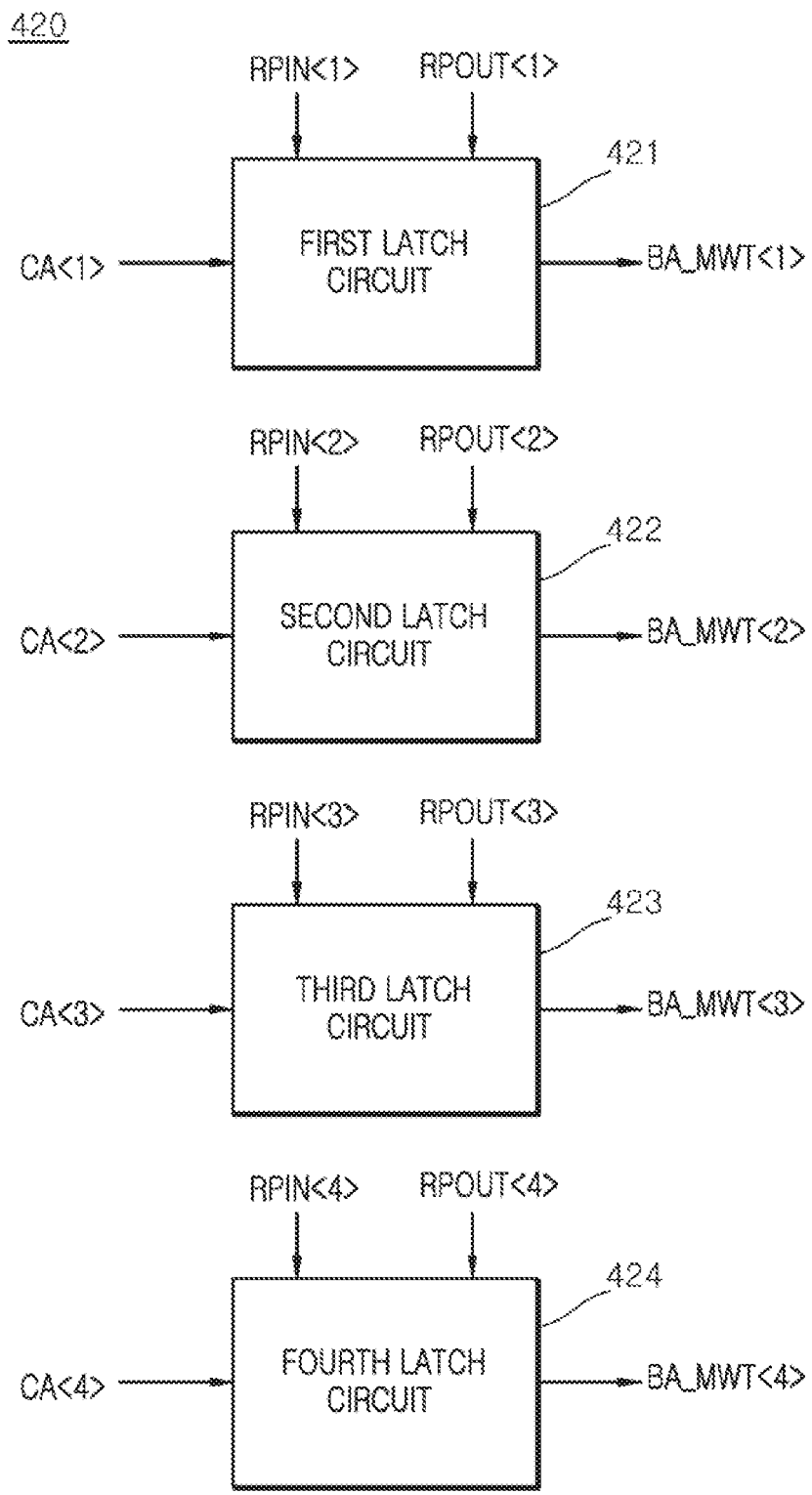
FIG. 5 shows a block diagram illustrating a configuration of a first pipe circuit included in the bank address generation circuit of FIG. 3.

Referring to FIG. 5, the first pipe circuit 420 may include a first latch circuit 421, a second latch circuit 422, a third latch circuit 423, and a fourth latch circuit 424.

The first latch circuit 421 may latch the first command/address signal CA<1> in response to the first read input signal RPIN<1>. The first latch circuit 421 may output the latched signal of the first command/address signal CA<1> as the first read bank address signal BA_MWT<1> in response to the first read output signal RPOUT<1>.

The second latch circuit 422 may latch the second command/address signal CA<2> in response to the second read input signal RPIN<2>. The second latch circuit 422 may output the latched signal of the second command/address signal CA<2> as the second read bank address signal BA_MWT<2> in response to the second read output signal RPOUT<2>.

The third latch circuit 423 may latch the third command/address signal CA<3> in response to the third read input signal RPIN<3>. The third latch circuit 423 may output the latched signal of the third command/address signal CA<3> as the third read bank address signal BA_MWT<3> in response to the third read output signal RPOUT<3>.

The fourth latch circuit 424 may latch the fourth command/address signal CA<4> in response to the fourth read input signal RPIN<4>. The fourth latch circuit 424 may output the latched signal of the fourth command/address signal CA<4> as the fourth read bank address signal BA_MWT<4> in response to the fourth read output signal RPOUT<4>.

Figure 6:
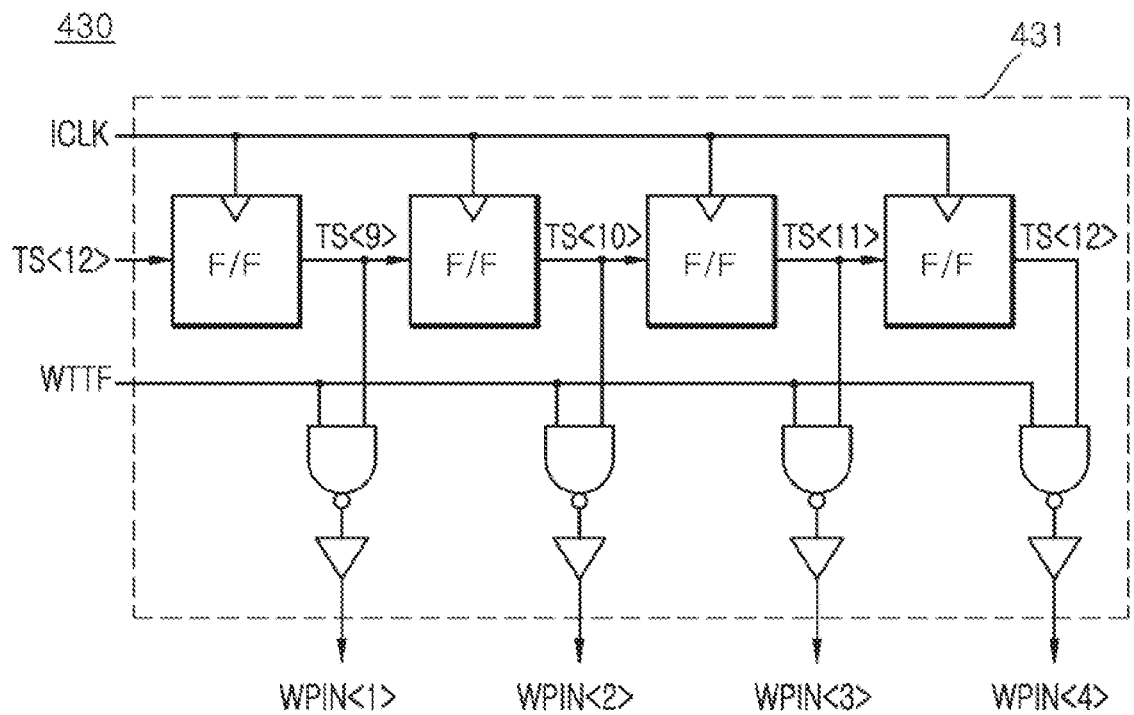
FIG. 6 shows a circuit diagram illustrating a configuration of a second counter included in the bank address generation circuit of FIG. 3.
Figure 6:
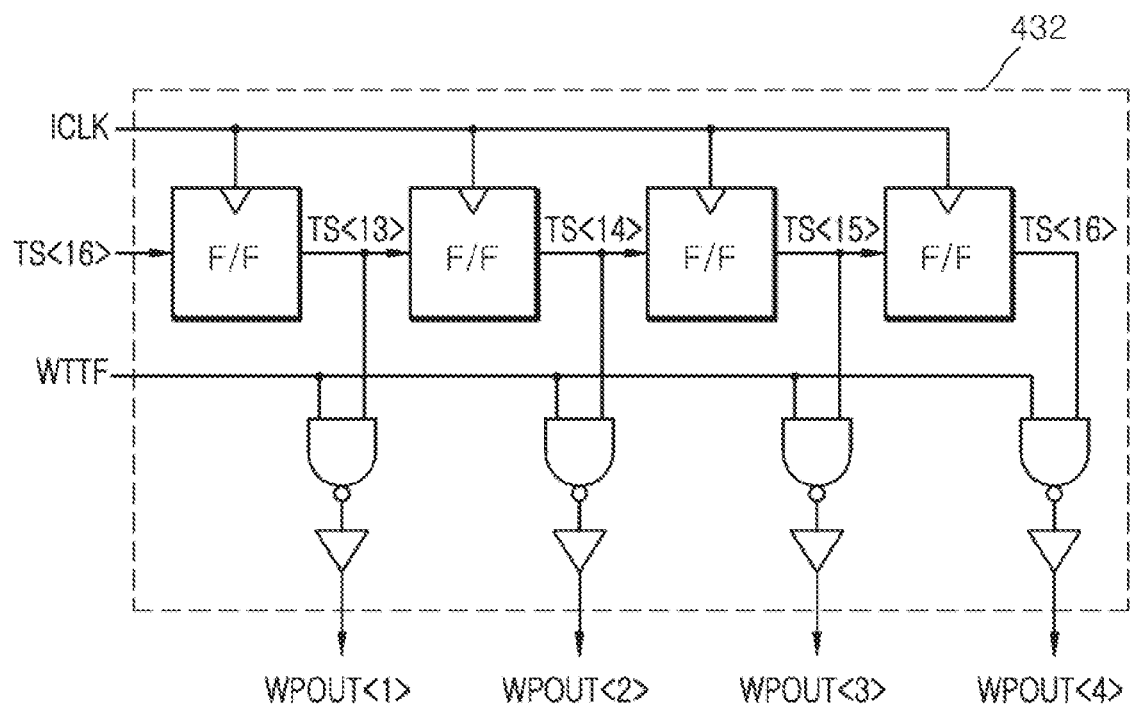

Referring to FIG. 6, the second counter 430 may include a write input signal generation circuit 431 and a write output signal generation circuit 432.

The write input signal generation circuit 431 may generate ninth to twelfth transmission signals TS<9:12>, which are sequentially enabled in response to the write control signal WTTF. The write input signal generation circuit 431 may output the ninth to twelfth transmission signals TS<9:12>, which are sequentially enabled while the write control signal WTTF is enabled, as the first to fourth write input signals WPIN<1:4>.

The write output signal generation circuit 432 may generate thirteenth to sixteenth transmission signals TS<13:16>, which are sequentially enabled in response to the write control signal WTTF. The write output signal generation circuit 432 may output the thirteenth to sixteenth transmission signals TS<13:16>, which are sequentially enabled while the write control signal WTTF is enabled, as the first to fourth write output signals WPOUT<1:4>.

Figure 7:
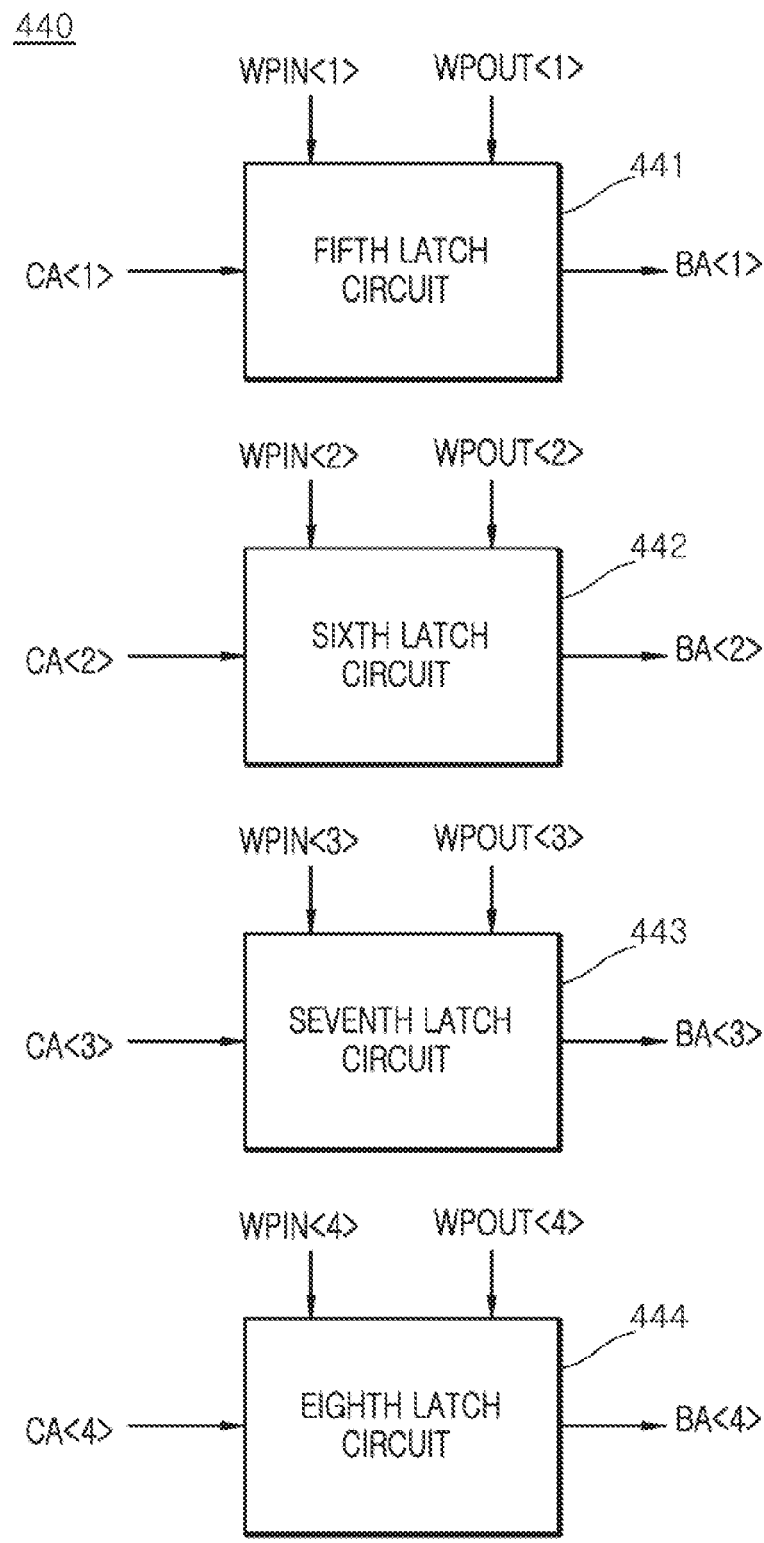
FIG. 7 shows a block diagram illustrating a configuration of a second pipe circuit included in the bank address generation circuit of FIG. 3.

Referring to FIG. 7, the second pipe circuit 440 may include a fifth latch circuit 441, a sixth latch circuit 442, a seventh latch circuit 443, and an eighth latch circuit 444.

The fifth latch circuit 441 may latch the first command/address signal CA<1> in response to the first write input signal WPIN<1>. The fifth latch circuit 441 may output the latched signal of the first command/address signal CA<1> as the first write bank address signal BA<1> in response to the first write output signal WPOUT<1>.

The sixth latch circuit 442 may latch the second command/address signal CA<2> in response to the second write input signal WPIN<2>. The sixth latch circuit 442 may output the latched signal of the second command/address signal CA<2> as the second write bank address signal BA<2> in response to the second write output signal WPOUT<2>.

The seventh latch circuit 443 may latch the third command/address signal CA<3> in response to the third write input signal WPIN<3>. The seventh latch circuit 443 may output the latched signal of the third command/address signal CA<3> as the third write bank address signal BA<3> in response to the third write output signal WPOUT<3>.

The eighth latch circuit 444 may latch the fourth command/address signal CA<4> in response to the fourth write input signal WPIN<4>. The eighth latch circuit 444 may output the latched signal of the fourth command/address signal CA<4> as the fourth write bank address signal BA<4> in response to the fourth write output signal WPOUT<4>.

Figure 8:
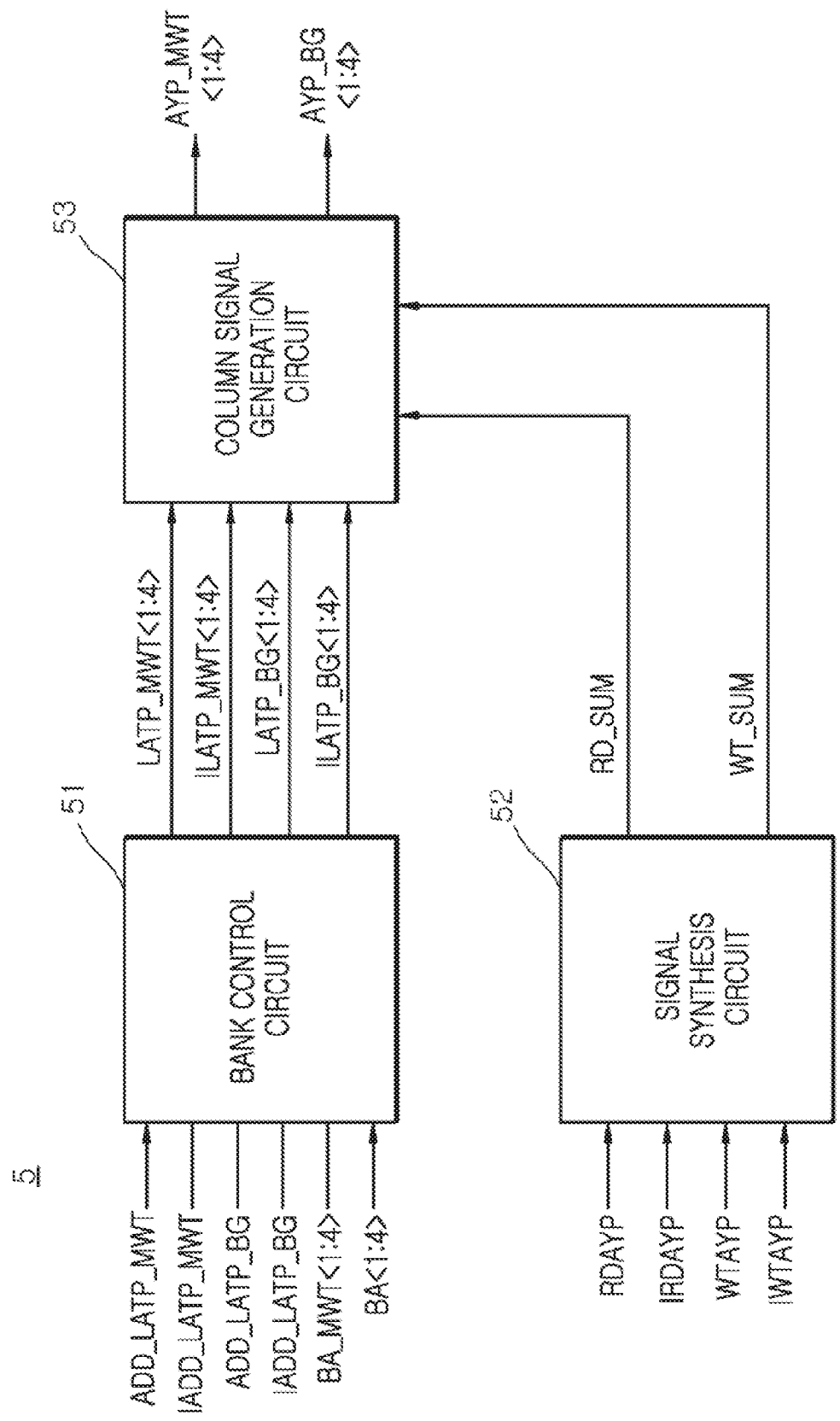
FIG. 8 shows a block diagram illustrating a configuration of a column control circuit included in the semiconductor device of FIG. 1.

Referring to FIG. 8, the column control circuit 5 may include a bank control circuit 51, a signal synthesis circuit 52, and a column signal generation circuit 53.

The bank control circuit 51 may generate first to fourth read latch address signals LATP_MWT<1:4> from the first to fourth read bank address signals BA_MWT<1:4> in response to the first read latch pulse ADD_LATP_MWT. The bank control circuit 51 may output the first to fourth read bank address signals BA_MWT<1:4> as the first to fourth read latch address signals LATP_MWT<1:4> if the first read latch pulse ADD_LATP_MWT is enabled. The bank control circuit 51 may generate first to fourth internal read latch address signals ILATP_MWT<1:4> from the first to fourth read bank address signals BA_MWT<1:4> in response to the second read latch pulse IADD_LATP_MWT. The bank control circuit 51 may output the first to fourth read bank address signals BA_MWT<1:4> as the first to fourth internal read latch address signals ILATP_MWT<1:4> if the second read latch pulse IADD_LATP_MWT is enabled.

The bank control circuit 51 may generate first to fourth write latch address signals LATP_BG<1:4> from the first to fourth write bank address signals BA<1:4> in response to the first write latch pulse ADD_LATP_BG. The bank control circuit 51 may output the first to fourth write bank address signals BA<1:4> as the first to fourth write latch address signals LATP_BG<1:4> if the first write latch pulse ADD_LATP_BG is enabled. The bank control circuit 51 may generate first to fourth internal write latch address signals ILATP_BG<1:4> from the first to fourth write bank address signals BA<1:4> in response to the second write latch pulse IADD_LATP_BG. The bank control circuit 51 may output the first to fourth write bank address signals BA<1:4> as the first to fourth internal write latch address signals ILATP_BG<1:4> if the second write latch pulse IADD_LATP_BG is enabled.

The signal synthesis circuit 52 may synthesize the first read pulse RDAYP and the second read pulse IRDAYP, which are sequentially enabled during the internal read operation, to generate a read synthesis signal RD_SUM. The signal synthesis circuit 52 may synthesize the first write pulse WTAYP and the second write pulse IWTAYP, which are sequentially enabled during the write operation, to generate a write synthesis signal WT_SUM.

The column signal generation circuit 53 may generate the first to fourth read column signals AYP_MWT<1:4> from the first to fourth read latch address signals LATP_MWT<1:4> or the first to fourth internal read latch address signals ILATP_MWT<1:4> in response to the read synthesis signal RD_SUM. The column signal generation circuit 53 may output the first to fourth read latch address signals LATP_MWT<1:4> or the first to fourth internal read latch address signals ILATP_MWT<1:4> as the first to fourth read column signals AYP_MWT<1:4> if the read synthesis signal RD_SUM is enabled. The column signal generation circuit 53 may generate the first to fourth write column signals AYP_BG<1:4> from the first to fourth write latch address signals LATP_BG<1:4> or the first to fourth internal write latch address signals ILATP_BG<1:4> in response to the write synthesis signal WT_SUM. The column signal generation circuit 53 may output the first to fourth write latch address signals LATP_BG<1:4> or the first to fourth internal write latch address signals ILATP_BG<1:4> as the first to fourth write column signals AYP_BG<1:4> if the write synthesis signal WT_SUM is enabled.

Figure 9:
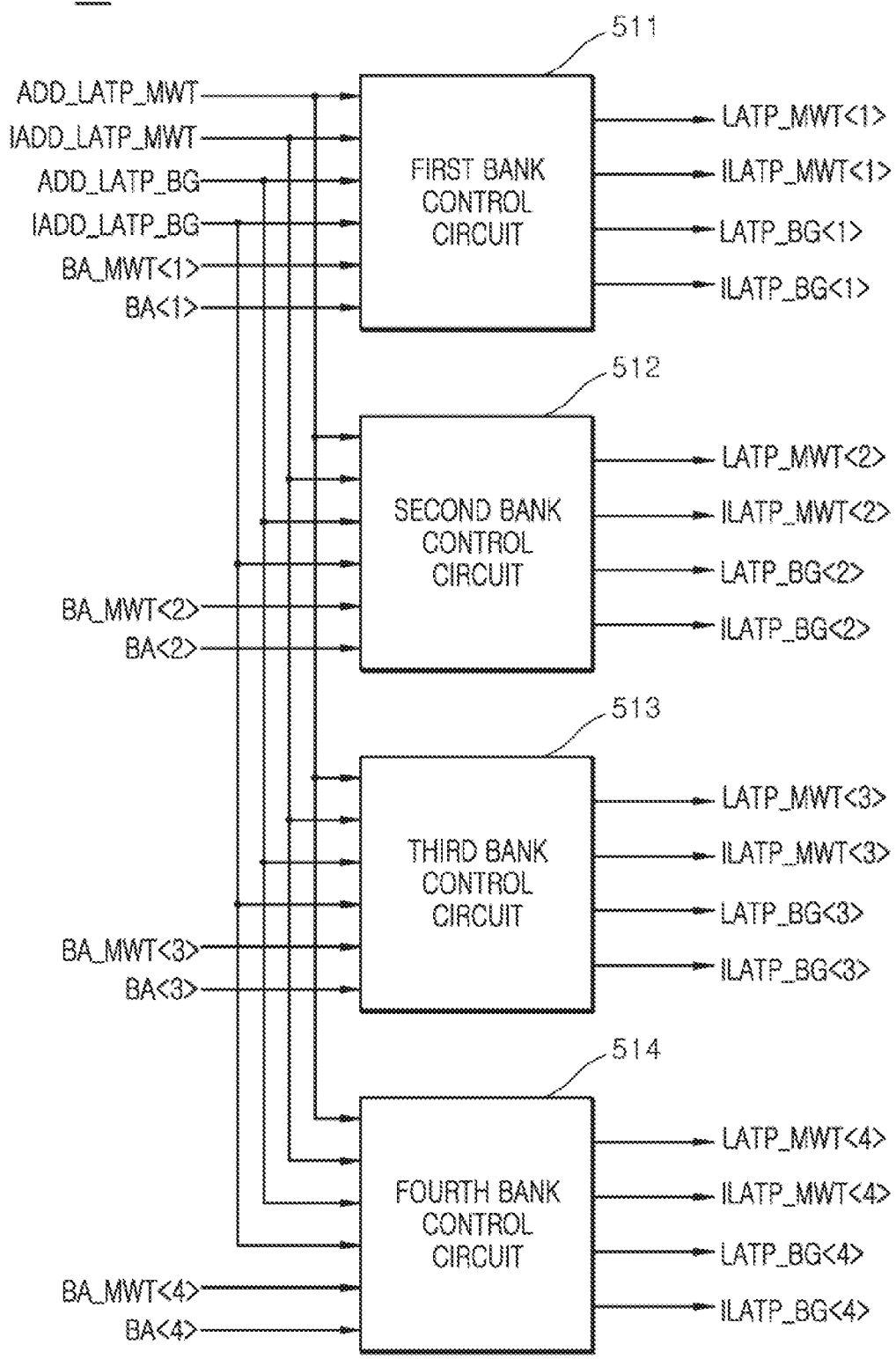
FIG. 9 shows a block diagram illustrating a configuration of a bank control circuit included in the column control circuit of FIG. 8.

Referring to FIG. 9, the bank control circuit 51 may include a first bank control circuit 511, a second bank control circuit 512, a third bank control circuit 513, and a fourth bank control circuit 514.

The first bank control circuit 511 may generate the first read latch address signal LATP_MWT<1> or the first internal read latch address signal ILATP_MWT<1> from the first read bank address signal BA_MWT<1> in response to the first read latch pulse ADD_LATP_MWT and the second read latch pulse IADD_LATP_MWT. The first bank control circuit 511 may generate the first write latch address signal LATP_BG<1> or the first internal write latch address signal ILATP_BG<1> from the first write bank address signal BA<1> in response to the first write latch pulse ADD_LATP_BG and the second write latch pulse IADD_LATP_BG.

The second bank control circuit 512 may generate the second read latch address signal LATP_MWT<2> or the second internal read latch address signal ILATP_MWT<2> from the second read bank address signal BA_MWT<2> in response to the first read latch pulse ADD_LATP_MWT and the second read latch pulse IADD_LATP_MWT. The second bank control circuit 512 may generate the second write latch address signal LATP_BG<2> or the second internal write latch address signal ILATP_BG<2> from the second write bank address signal BA<2> in response to the first write latch pulse ADD_LATP_BG and the second write latch pulse IADD_LATP_BG.

The third bank control circuit 513 may generate the third read latch address signal LATP_MWT<3> or the third internal read latch address signal ILATP_MWT<3> from the third read bank address signal BA_MWT<3> in response to the first read latch pulse ADD_LATP_MWT and the second read latch pulse IADD_LATP_MWT. The third bank control circuit 513 may generate the third write latch address signal LATP_BG<3> or the third internal write latch address signal ILATP_BG<3> from the third write bank address signal BA<3> in response to the first write latch pulse ADD_LATP_BG and the second write latch pulse IADD_LATP_BG.

The fourth bank control circuit 514 may generate the fourth read latch address signal LATP_MWT<4> or the fourth internal read latch address signal ILATP_MWT<4> from the fourth read bank address signal BA_MWT<4> in response to the first read latch pulse ADD_LATP_MWT and the second read latch pulse IADD_LATP_MWT. The fourth bank control circuit 514 may generate the fourth write latch address signal LATP_BG<4> or the fourth internal write latch address signal ILATP_BG<4> from the fourth write bank address signal BA<4> in response to the first write latch pulse ADD_LATP_BG and the second write latch pulse IADD_LATP_BG.

Figure 10:
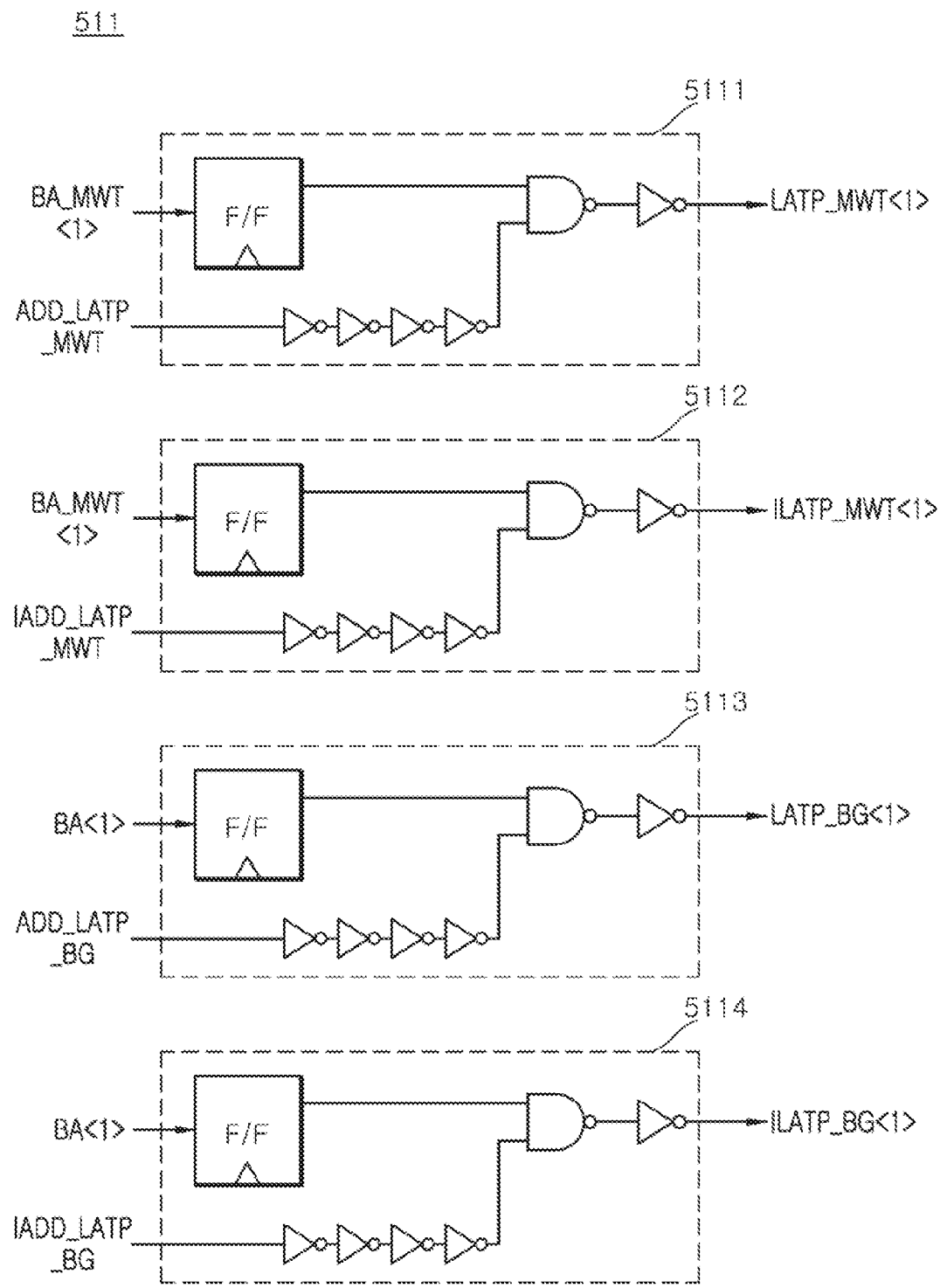
FIG. 10 shows a circuit diagram illustrating a configuration of a first bank control circuit included in the bank control circuit of FIG. 9.

Referring to FIG. 10, the first bank control circuit 511 may include a first pulse generation circuit 5111, a second pulse generation circuit 5112, a third pulse generation circuit 5113, and a fourth pulse generation circuit 5114.

The first pulse generation circuit 5111 may generate the first read latch address signal LATP_MWT<1> from the first read bank address signal BA_MWT<1> in response to the first read latch pulse ADD_LATP_MWT. The first pulse generation circuit 5111 may generate the first read latch address signal LATP_MWT<1> from the first read bank address signal BA_MWT<1> if the first read latch pulse ADD_LATP_MWT having a logic "high" level is inputted to the first pulse generation circuit 5111.

The second pulse generation circuit 5112 may generate the first internal read latch address signal ILATP_MWT<1> from the first read bank address signal BA_MWT<1> in response to the second read latch pulse IADD_LATP_MWT. The second pulse generation circuit 5112 may generate the first internal read latch address signal ILATP_MWT<1> from the first read bank address signal BA_MWT<1> if the second read latch pulse IADD_LATP_MWT having a logic "high" level is inputted to the second pulse generation circuit 5112.

The third pulse generation circuit 5113 may generate the first write latch address signal LATP_BG<1> from the first write bank address signal BA<1> in response to the first write latch pulse ADD_LATP_BG. The third pulse generation circuit 5113 may generate the first write latch address signal LATP_BG<1> from the first write bank address signal BA<1> if the first write latch pulse ADD_LATP_BG having a logic "high" level is inputted to the third pulse generation circuit 5113.

The fourth pulse generation circuit 5114 may generate the first internal write latch address signal ILATP_BG<1> from the first write bank address signal BA<1> in response to the second write latch pulse IADD_LATP_BG. The fourth pulse generation circuit 5114 may generate the first internal write latch address signal ILATP_BG<1> from the first write bank address signal BA<1> if the second write latch pulse IADD_LATP_BG having a logic "high" level is inputted to the fourth pulse generation circuit 5114.

Each of the second, third and fourth bank control circuits 512, 513 and 514 may be realized to have substantially the same configuration as the first bank control circuit 511 illustrated in FIG. 10 except input/output (I/O) signals thereof. Accordingly, each of the second, third, and fourth bank control circuits 512, 513, and 514 may perform substantially the same operation as the first bank control circuit 511. Thus, detailed descriptions of the second, third, and fourth bank control circuits 512, 513, and 514 are omitted here.

Figure 11:
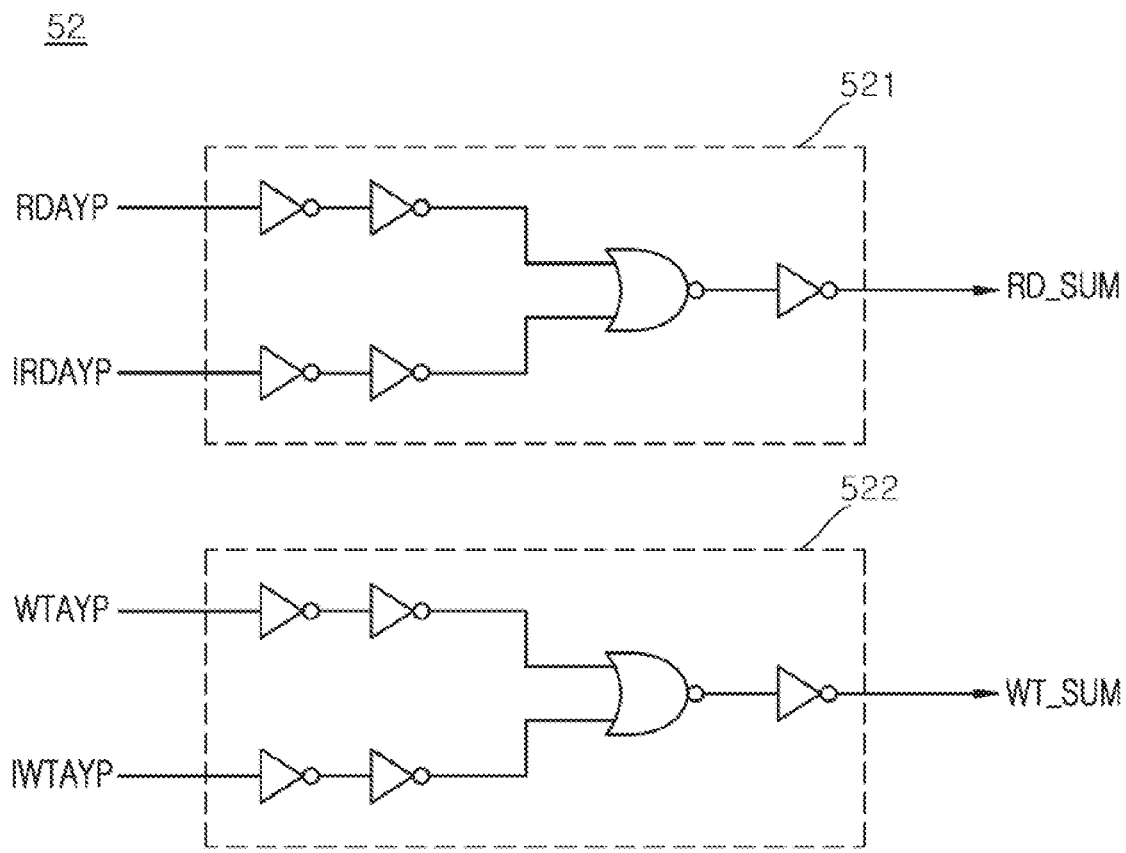
FIG. 11 shows a circuit diagram illustrating a configuration of a signal synthesis circuit included in the column control circuit of FIG. 8.

Referring to FIG. 11, the signal synthesis circuit 52 may include a first synthesis circuit 521 and a second synthesis circuit 522.

The first synthesis circuit 521 may generate the read synthesis signal RD_SUM, which is enabled if any one of the first and second read pulses RDAYP and IRDAYP is inputted to the first synthesis circuit 521. The first synthesis circuit 521 may perform a logical OR operation of the first and second read pulses RDAYP and IRDAYP to generate the read synthesis signal RD_SUM. The first synthesis circuit 521 may generate the read synthesis signal RD_SUM, which is enabled to have a logic "high" level if any one of the first and second read pulses RDAYP and IRDAYP inputted to the first synthesis circuit 521 has a logic "high" level.

The second synthesis circuit 522 may generate the write synthesis signal WT_SUM, which is enabled if any one of the first and second write pulses WTAYP and IWTAYP is inputted to the second synthesis circuit 522. The second synthesis circuit 522 may perform a logical OR operation of the first and second write pulses WTAYP and IWTAYP to generate the write synthesis signal WT_SUM. The second synthesis circuit 522 may generate the write synthesis signal WT_SUM, which is enabled to have a logic "high" level if any one of the first and second write pulses WTAYP and IWTAYP inputted to the second synthesis circuit 522 has a logic "high" level.

Figure 12:
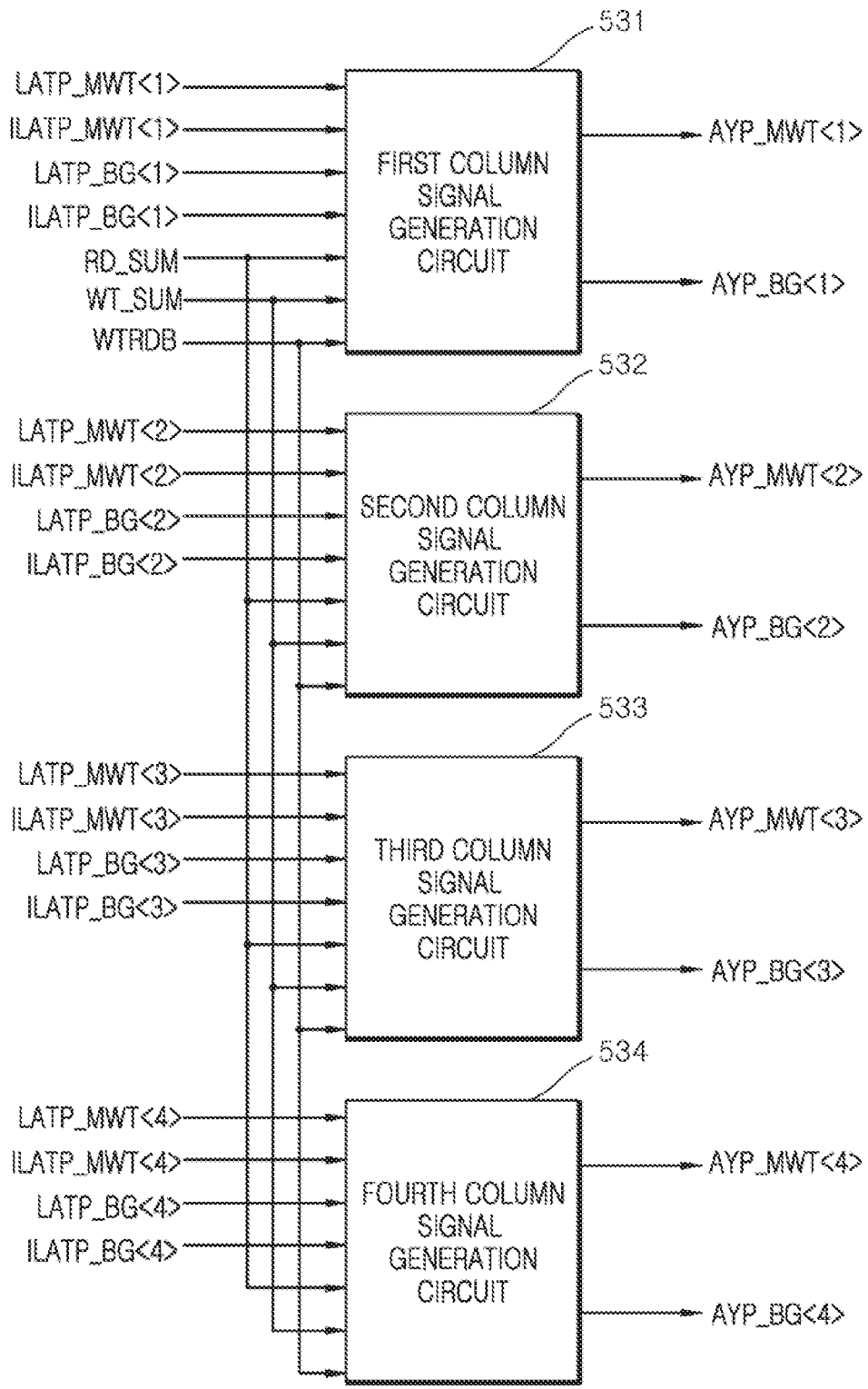
FIG. 12 shows a block diagram illustrating a configuration of a column signal generation circuit included in the column control circuit of FIG. 8.

Referring to FIG. 12, the column signal generation circuit 53 may include a first column signal generation circuit 531, a second column signal generation circuit 532, a third column signal generation circuit 533, and a fourth column signal generation circuit 534.

The first column signal generation circuit 531 may output the first read latch address signal LATP_MWT<1> and the first internal read latch address signal ILATP_MWT<1> as the first read column signal AYP_MWT<1> in response to the read synthesis signal RD_SUM. The first column signal generation circuit 531 may output the first read latch address signal LATP_MWT<1> and the first internal read latch address signal ILATP_MWT<1> as the first read column signal AYP_MWT<1> if the read synthesis signal RD_SUM is enabled to have a logic "high" level. The first column signal generation circuit 531 may output the first write latch address signal LATP_BG<1> and the first internal write latch address signal ILATP_BG<1> as the first write column signal AYP_BG<1> in response to the write synthesis signal WT_SUM. The first column signal generation circuit 531 may output the first write latch address signal LATP_BG<1> and the first internal write latch address signal ILATP_BG<1> as the first write column signal AYP_BG<1> if the write synthesis signal WT_SUM is enabled to have a logic "high" level. The first column signal generation circuit 531 may interrupt the input of the first write latch address signal LATP_BG<1> and the first internal write latch address signal ILATP_BG<1> in response to a write/read control signal WTRDB. The first column signal generation circuit 531 may interrupt the input of the first write latch address signal LATP_BG<1> and the first internal write latch address signal ILATP_BG<1> if the write/read control signal WTRDB is enabled to have a logic "high" level. The write/read control signal WTRDB may be enabled to have a logic "high" level when the internal read operation is performed.

The second column signal generation circuit 532 may output the second read latch address signal LATP_MWT<2> and the second internal read latch address signal ILATP_MWT<2> as the second read column signal AYP_MWT<2> in response to the read synthesis signal RD_SUM. The second column signal generation circuit 532 may output the second read latch address signal LATP_MWT<2> and the second internal read latch address signal ILATP_MWT<2> as the second read column signal AYP_MWT<2> if the read synthesis signal RD_SUM is enabled to have a logic "high" level. The second column signal generation circuit 532 may output the second write latch address signal LATP_BG<2> and the second internal write latch address signal ILATP_BG<2> as the second write column signal AYP_BG<2> in response to the write synthesis signal WT_SUM. The second column signal generation circuit 532 may output the second write latch address signal LATP_BG<2> and the second internal write latch address signal ILATP_BG<2> as the second write column signal AYP_BG<2> if the write synthesis signal WT_SUM is enabled to have a logic "high" level. The second column signal generation circuit 532 may interrupt the input of the second write latch address signal LATP_BG<2> and the second internal write latch address signal ILATP_BG<2> in response to the write/read control signal WTRDB. The second column signal generation circuit 532 may interrupt the input of the second write latch address signal LATP_BG<2> and the second internal write latch address signal ILATP_BG<2> if the write/read control signal WTRDB is enabled to have a logic "high" level.

The third column signal generation circuit 533 may output the third read latch address signal LATP_MWT<3> and the third internal read latch address signal ILATP_MWT<3> as the third read column signal AYP_MWT<3> in response to the read synthesis signal RD_SUM. The third column signal generation circuit 533 may output the third read latch address signal LATP_MWT<3> and the third internal read latch address signal ILATP_MWT<3> as the third read column signal AYP_MWT<3> if the read synthesis signal RD_SUM is enabled to have a logic "high" level. The third column signal generation circuit 533 may output the third write latch address signal LATP_BG<3> and the third internal write latch address signal ILATP_BG<3> as the third write column signal AYP_BG<3> in response to the write synthesis signal WT_SUM. The third column signal generation circuit 533 may output the third write latch address signal LATP_BG<3> and the third internal write latch address signal ILATP_BG<3> as the third write column signal AYP_BG<3> if the write synthesis signal WT_SUM is enabled to have a logic "high" level. The third column signal generation circuit 533 may interrupt the input of the third write latch address signal LATP_BG<3> and the third internal write latch address signal ILATP_BG<3> in response to the write/read control signal WTRDB. The third column signal generation circuit 533 may interrupt the input of the third write latch address signal LATP_BG<3> and the third internal write latch address signal ILATP_BG<3> if the write/read control signal WTRDB is enabled to have a logic "high" level.

The fourth column signal generation circuit 534 may output the fourth read latch address signal LATP_MWT<4> and the fourth internal read latch address signal ILATP_MWT<4> as the fourth read column signal AYP_MWT<4> in response to the read synthesis signal RD_SUM. The fourth column signal generation circuit 534 may output the fourth read latch address signal LATP_MWT<4> and the fourth internal read latch address signal ILATP_MWT<4> as the fourth read column signal AYP_MWT<4> if the read synthesis signal RD_SUM is enabled to have a logic "high" level. The fourth column signal generation circuit 534 may output the fourth write latch address signal LATP_BG<4> and the fourth internal write latch address signal ILATP_BG<4> as the fourth write column signal AYP_BG<4> in response to the write synthesis signal WT_SUM. The fourth column signal generation circuit 534 may output the fourth write latch address signal LATP_BG<4> and the fourth internal write latch address signal ILATP_BG<4> as the fourth write column signal AYP_BG<4> if the write synthesis signal WT_SUM is enabled to have a logic "high" level. The fourth column signal generation circuit 534 may interrupt the input of the fourth write latch address signal LATP_BG<4> and the fourth internal write latch address signal ILATP_BG<4> in response to the write/read control signal WTRDB. The fourth column signal generation circuit 534 may interrupt the input of the fourth write latch address signal LATP_BG<4> and the fourth internal write latch address signal ILATP_BG<4> if the write/read control signal WTRDB is enabled to have a logic "high" level.

Figure 13:
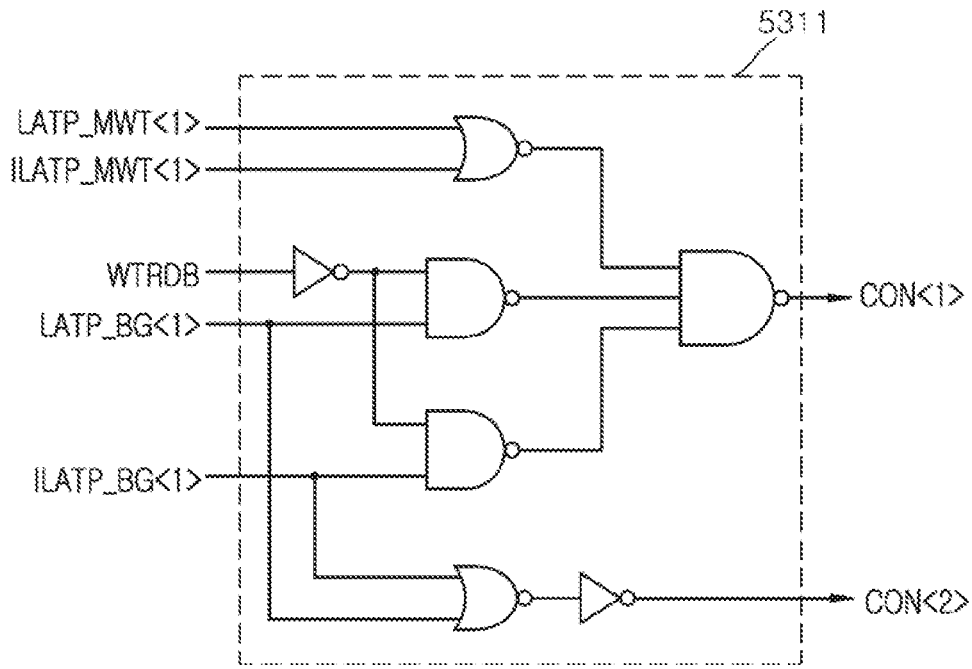
FIG. 13 shows a circuit diagram illustrating a configuration of a first column signal generation circuit included in the column signal generation circuit of FIG. 12.
Figure 13:
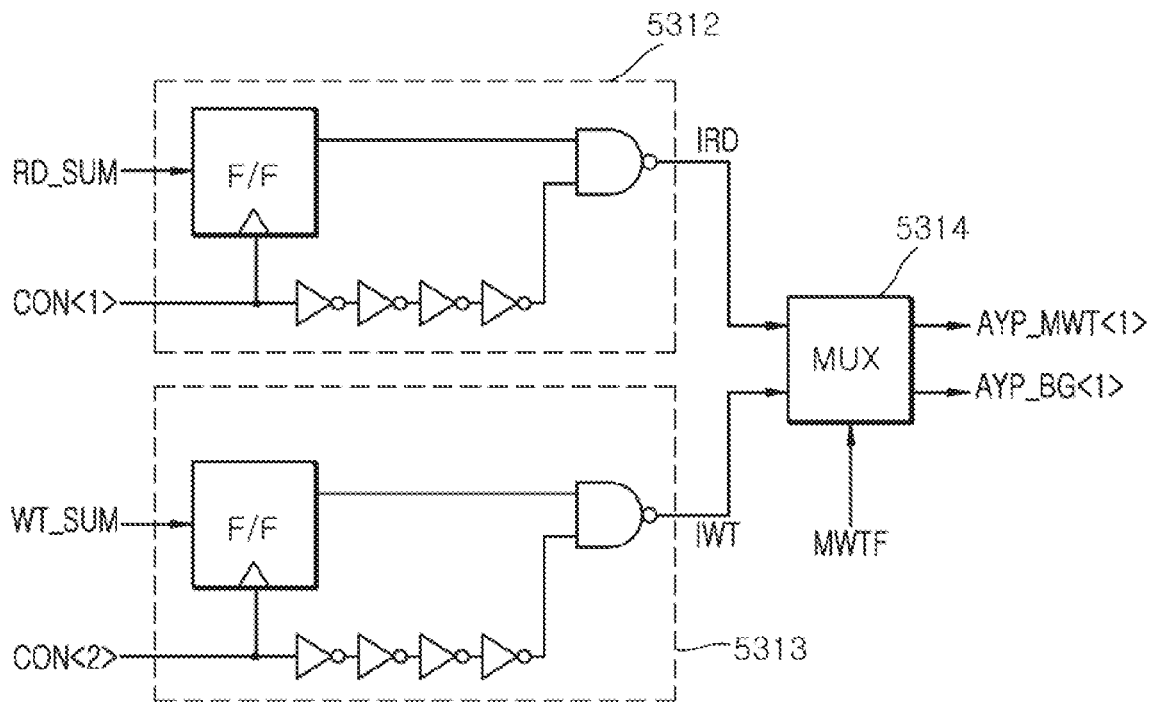

Referring to FIG. 13, the first column signal generation circuit 531 may include a control signal generation circuit 5311, an internal read signal generation circuit 5312, an internal write signal generation circuit 5313, and a selection/transmission circuit 5314.

The control signal generation circuit 5311 may generate a first control signal CON<1>, which is enabled in response to the first read latch address signal LATP_MWT<1> and the first internal read latch address signal ILATP_MWT<1>. The control signal generation circuit 5311 may generate the first control signal CON<1>, which is enabled to have a logic "high" level if any one of the first read latch address signal LATP_MWT<1> and the first internal read latch address signal ILATP_MWT<1> inputted to the control signal generation circuit 5311 has a logic "high" level.

The control signal generation circuit 5311 may generate the first control signal CON<1> from the first write latch address signal LATP_BG<1> and the first internal write latch address signal ILATP_BG<1> in response to the write/read control signal WTRDB. The control signal generation circuit 5311 may generate the first control signal CON<1> from the first write latch address signal LATP_BG<1> and the first internal write latch address signal ILATP_BG<1> if the write/read control signal WTRDB is disabled to have a logic "low" level. The control signal generation circuit 5311 may interrupt the input of the first write latch address signal LATP_BG<1> and the first internal write latch address signal ILATP_BG<1> to generate the first control signal CON<1> having a logic "low" level if the write/read control signal WTRDB is enabled to have a logic "high" level.

The control signal generation circuit 5311 may generate a second control signal CON<2> from the first write latch address signal LATP_BG<1> and the first internal write latch address signal ILATP_BG<1>. The control signal generation circuit 5311 may generate the second control signal CON<2>, which is enabled to have a logic "high" level if any one of the first write latch address signal LATP_BG<1> and the first internal write latch address signal ILATP_BG<1> inputted to the control signal generation circuit 5311 has a logic "high" level.

The internal read signal generation circuit 5312 may latch the read synthesis signal RD_SUM to generate an internal read signal IRD in response to the first control signal CON<1>. The internal read signal generation circuit 5312 may latch the read synthesis signal RD_SUM to generate the internal read signal IRD if the first control signal CON<1> is enabled to have a logic "high" level.

The internal write signal generation circuit 5313 may latch the write synthesis signal WT_SUM to generate an internal write signal IWT in response to the second control signal CON<2>. The internal write signal generation circuit 5313 may latch the write synthesis signal WT_SUM to generate the internal write signal IWT if the second control signal CON<2> is enabled to have a logic "high" level.

The selection/transmission circuit 5314 may output the internal read signal IRD (or the internal write signal IWT) as the first read column signal AYP_MWT<1> (or the first write column signal AYP_BG<1>) in response to a flag signal MWTF. The selection/transmission circuit 5314 may output the internal read signal IRD as the first read column signal AYP_MWT<1> if the flag signal MWTF is enabled. The selection/transmission circuit 5314 may output the internal write signal IWT as the first write column signal AYP_BG<1> if the flag signal MWTF is disabled. The flag signal MWTF may be enabled when the internal read operation is performed.

Each of the second, third, and fourth column signal generation circuits 532, 533, and 534 may be realized to have substantially the same configuration as the first column signal generation circuit 531 illustrated in FIG. 13 except input/output (I/O) signals thereof. Accordingly, each of the second, third, and fourth column signal generation circuits 532, 533, and 534 may perform substantially the same operation as the first column signal generation circuit 531.

Thus, detailed descriptions of the second, third, and fourth column signal generation circuits 532, 533, and 534 are omitted here.

Figure 14:
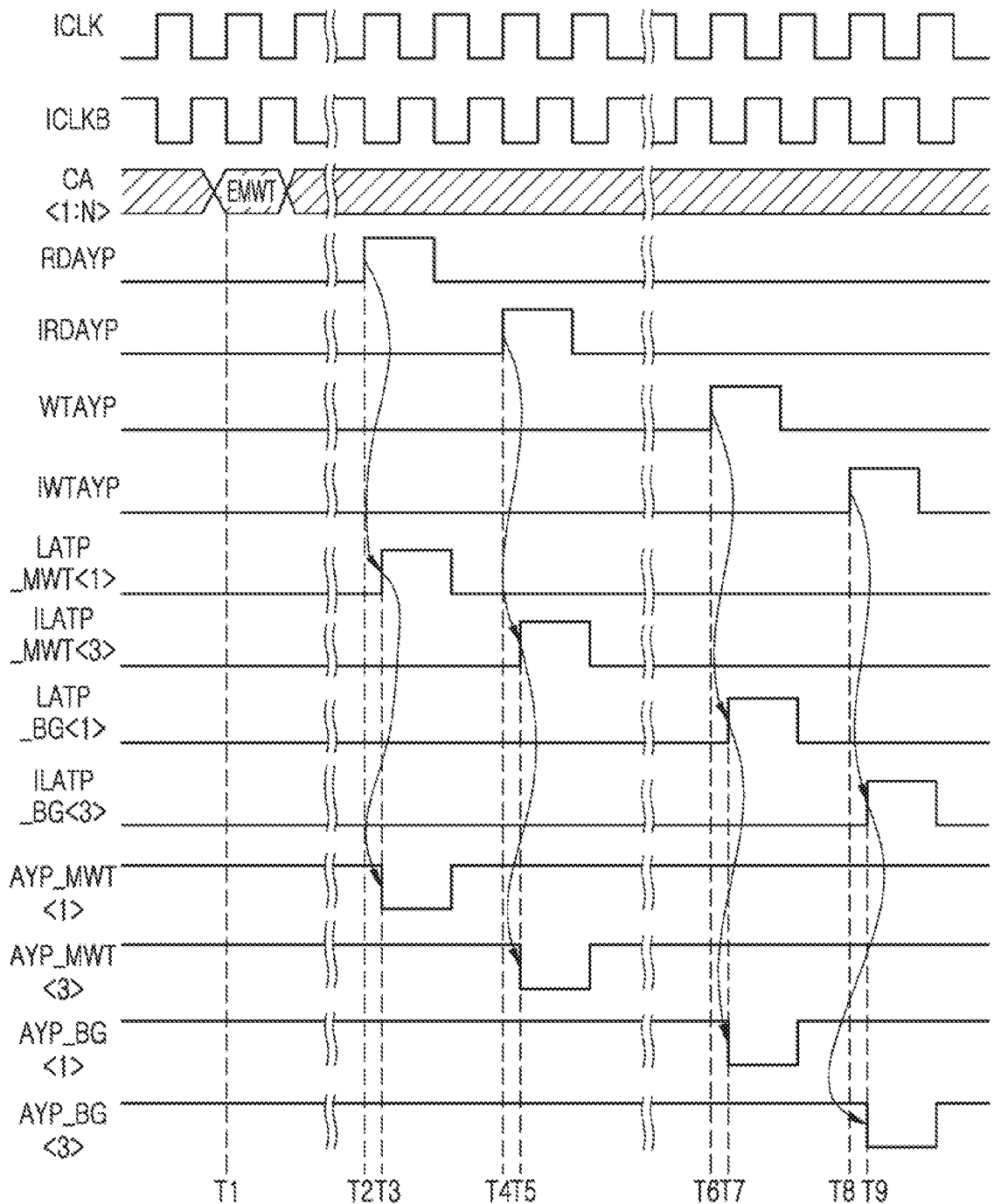
FIG. 14 shows a timing diagram illustrating an operation of a semiconductor device, according to an embodiment of the present disclosure.

An operation of a semiconductor device according to an embodiment is described below with reference to FIG. 14 in conjunction with the internal read operation and the write operation, which are performed by activation of the first and third banks BK1 and BK3.

At a time "T1," the command/address signal CA<1:N> having a logic level combination for performing the masked write operation may be inputted to the command decoder 1.

The command decoder 1 may decode the command/address signal CA<1:N> in synchronization with the internal clock signal ICLK and the inverted internal clock signal ICLKB to generate the masked write signal EMWT.

At a time "T2," the read/write control circuit 2 may generate the first read pulse RDAYP in response to the masked write signal EMWT, which is generated at the time "T1."

At time "T3," the latch pulse generation circuit 3 may latch the first read pulse RDAYP and may delay the latched pulse of the first read pulse RDAYP by a predetermined period to generate the first read latch pulse ADD_LATP_MWT.

The bank control circuit 51 of the column control circuit 5 may generate the first read latch address signal LATP_MWT<1> from the first read bank address signal BA_MWT<1> in response to the first read latch pulse ADD_LATP_MWT.

The signal synthesis circuit 52 of the column control circuit 5 may synthesize the first read pulse RDAYP and the second read pulse IRDAYP to generate the read synthesis signal RD_SUM.

The column signal generation circuit 53 of the column control circuit 5 may generate the first read column signal AYP_MWT<1> from the first read latch address signal LATP_MWT<1> in response to the read synthesis signal RD_SUM.

The first bank BK1 of the core circuit 6 may perform the internal read operation in response to the first read column signal AYP_MWT<1>. A burst length of data outputted from the first bank BK1 during the internal read operation may be set to be "16." The burst length of "16" means that 16-bit data are outputted from the first bank BK1 whenever the internal read operation is performed once.

At a time "T4," the read/write control circuit 2 may generate the second read pulse IRDAYP in response to the masked write signal EMWT which is generated at the time "T1."

At a time "T5," the latch pulse generation circuit 3 may latch the second read pulse IRDAYP and may delay the latched pulse of the second read pulse IRDAYP by the predetermined period to generate the second read latch pulse IADD_LATP_MWT.

The bank control circuit 51 of the column control circuit 5 may generate the third internal read latch address signal ILATP_MWT<3> from the third read bank address signal BA_MWT<3> in response to the second read latch pulse IADD_LATP_MWT.

The signal synthesis circuit 52 of the column control circuit 5 may synthesize the first read pulse RDAYP and the second read pulse IRDAYP to generate the read synthesis signal RD_SUM.

The column signal generation circuit 53 of the column control circuit 5 may generate the third read column signal AYP_MWT<3> from the third internal read latch address signal ILATP_MWT<3> in response to the read synthesis signal RD_SUM.

The third bank BK3 of the core circuit 6 may perform the internal read operation in response to the third read column signal AYP_MWT<3>. A burst length of data outputted from the third bank BK3 during the internal read operation may be set to be "16." The burst length of "16" means that 16-bit data are outputted from the third bank BK3 whenever the internal read operation is performed once.

Meanwhile, the semiconductor device, according to an embodiment, may perform a 16-burst length operation executed at the time "T3" and another 16-burst length operation executed at the "T5" in response to the masked write signal EMWT inputted at the time "T1," thereby performing a 32-burst length operation. The 32-burst length operation means an operation for which 32-bit data are outputted from the core circuit 6 whenever the masked write signal EMWT is generated once.

At a time "T6," the read/write control circuit 2 may generate the first write pulse WTAYP in response to the masked write signal EMWT which is generated at the time "T1."

At a time "T7," the latch pulse generation circuit 3 may latch the first write pulse WTAYP and may delay the latched pulse of the first write pulse WTAYP by the predetermined period to generate the first write latch pulse ADD_LATP_BG.

The bank control circuit 51 of the column control circuit 5 may generate the first write latch address signal LATP_BG<1> from the first write bank address signal BA<1> in response to the first write latch pulse ADD_LATP_BG.

The signal synthesis circuit 52 of the column control circuit 5 may synthesize the first write pulse WTAYP and the second write pulse IWTAYP to generate the write synthesis signal WT_SUM.

The column signal generation circuit 53 of the column control circuit 5 may generate the first write column signal AYP_BG<1> from the first write latch address signal LATP_BG<1> in response to the write synthesis signal WT_SUM.

The first bank BK1 of the core circuit 6 may perform the write operation in response to the first write column signal AYP_BG<1>. A burst length of data inputted to the first bank BK1 during the write operation may be set to be "16." The burst length of "16" means that 16-bit data are inputted to the first bank BK1 whenever the write operation is performed once.

At a time "T8," the read/write control circuit 2 may generate the second write pulse IWTAYP in response to the masked write signal EMWT which is generated at the time "T1."

At a time "T9," the latch pulse generation circuit 3 may latch the second write pulse IWTAYP and may delay the latched pulse of the second write pulse IWTAYP by the predetermined period to generate the second write latch pulse IADD_LATP_BG.

The bank control circuit 51 of the column control circuit 5 may generate the third internal write latch address signal ILATP_BG<3> from the third write bank address signal BA<3> in response to the second write latch pulse IADD_LATP_BG.

The signal synthesis circuit 52 of the column control circuit 5 may synthesize the first write pulse WTAYP and the second write pulse IWTAYP to generate the write synthesis signal WT_SUM.

The column signal generation circuit 53 of the column control circuit 5 may generate the third write column signal AYP_BG<3> from the third internal write latch address signal ILATP_BG<3> in response to the write synthesis signal WT_SUM.

The third bank BK3 of the core circuit 6 may perform the write operation in response to the third write column signal AYP_BG<3>. A burst length of data inputted to the third bank BK3 during the write operation may be set to be "16." The burst length of "16" means that 16-bit data are inputted to the third bank BK3 whenever the write operation is performed once.

Meanwhile, the semiconductor device, according to an embodiment, may perform a 16-burst length operation executed at the time "T7" and another 16-burst length operation executed at the time "T9" in response to the masked write signal EMWT inputted at the time "T1," thereby performing a 32-burst length operation. The 32-burst length operation means an operation for which 32-bit data are inputted to the core circuit 6 whenever the masked write signal EMWT is generated once.

In addition, the semiconductor device, according to an embodiment, may sequentially perform the internal read operation for outputting 32-bit data from the core circuit 6 and the write operation for storing 32-bit data into the core circuit 6 whenever the masked write signal EMWT is generated once.

As described above, a semiconductor device according to an embodiment may sequentially generate a column signal for performing an internal read operation and a column signal for performing a write operation during a masked write operation, thereby preventing the column signal for the internal read operation from colliding with the column signal for the write operation. As a result, it may be possible to improve the reliability of the masked write operation of the semiconductor device.

Figure 15:
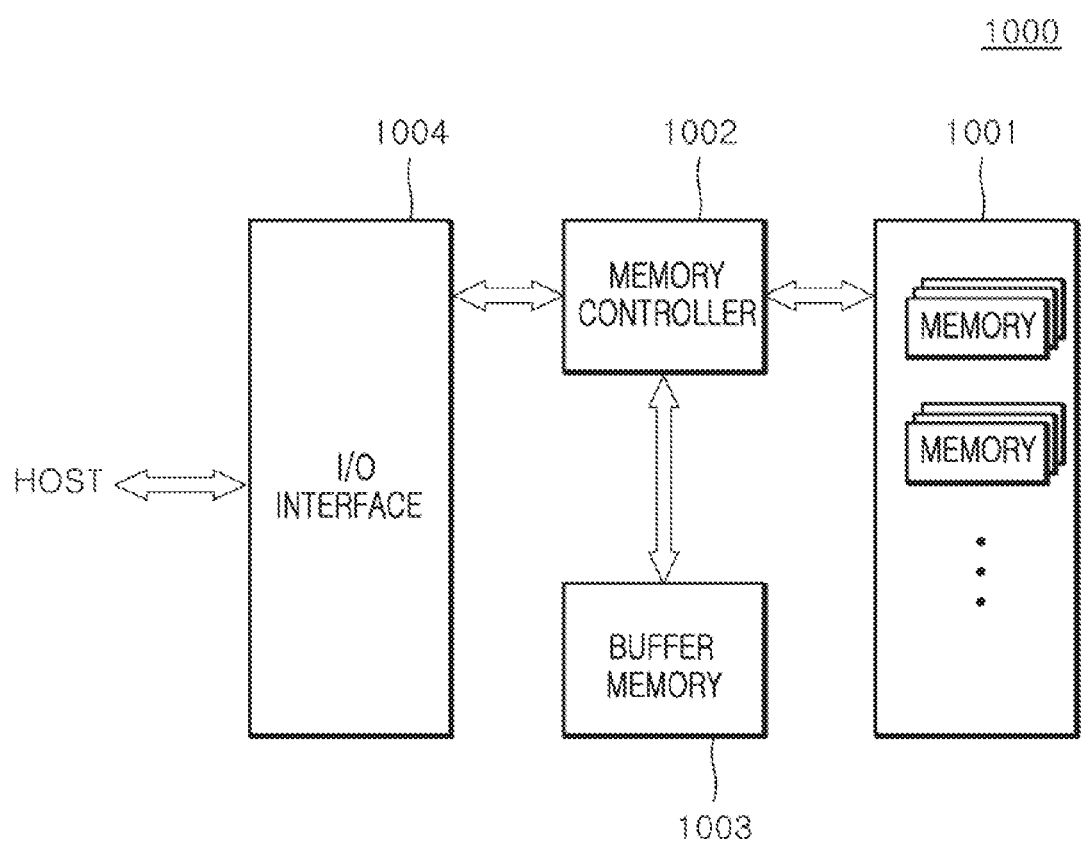
FIG. 15 shows a block diagram illustrating a configuration of an electronic system including the semiconductor device shown in FIGS. 1 to 14.

The semiconductor device described with reference to FIGS. 1 to 14 may be applied to an electronic system that includes a memory system, a graphic system, a computing system, a mobile system, or the like. For example, as illustrated in FIG. 15, an electronic system 1000, according an embodiment, may include a data storage circuit 1001, a memory controller 1002, a buffer memory 1003, and an input/output (I/O) interface 1004.

The data storage circuit 1001 may store data which are outputted from the memory controller 1002 or may read and output the stored data to the memory controller 1002, according to a control signal outputted from the memory controller 1002. The data storage circuit 1001 may include the semiconductor device illustrated in FIG. 1. Meanwhile, the data storage circuit 1001 may include a nonvolatile memory which can retain its stored data even when its power supply is interrupted. The nonvolatile memory may be a flash memory, such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage circuit 1001 or the buffer memory 1003 or for outputting the data stored in the data storage circuit 1001 or the buffer memory 1003. Although FIG. 15 illustrates the memory controller 1002 with a single block, the memory controller 1002 may include one controller for controlling the data storage circuit 1001 and another controller for controlling the buffer memory 1003 including a volatile memory.

The buffer memory 1003 may temporarily store the data to be processed by the memory controller 1002. That is, the buffer memory 1003 may temporarily store the data which are outputted from or to be inputted to the data storage circuit 1001. The buffer memory 1003 may store the data, which are outputted from the memory controller 1002, according to a control signal. The buffer memory 1003 may read and output the stored data to the memory controller 1002. The buffer memory 1003 may include a volatile memory, such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data outputted from the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB), a multimedia card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI), and an integrated drive electronics (IDE).

The electronic system 1000 may be used as an auxiliary storage device of the host or as an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

What is claimed is:

1. A semiconductor device comprising:
a column control circuit configured to generate a read column signal and a write column signal from a read bank address signal and a write bank address signal in response to a read latch pulse and a write latch pulse, which are generated during a masked write operation; and
a core circuit comprising a plurality of banks, wherein at least one of:
a bank of the plurality of banks is activated by the read column signal to perform an internal read operation, and
a bank of the plurality of banks is activated by the write column signal to perform a write operation.

2. The semiconductor device of claim 1, wherein the masked write operation includes performing the internal read operation and the write operation which are sequentially performed.

3. The semiconductor device of claim 1, wherein the bank activated during the write operation is identical to the bank activated during the internal read operation.

4. The semiconductor device of claim 1, wherein the column control circuit interrupts the write latch pulse from being inputted to the column control circuit during the internal read operation.

5. The semiconductor device of claim 1,
wherein the read latch pulse includes first and second read latch pulses;
wherein the read bank address signal includes first, second, third, and fourth read bank address signals;
wherein the write latch pulse includes first and second write latch pulses;
wherein the write bank address signal includes first, second, third, and fourth write bank address signals;
wherein the read column signal includes first, second, third, and fourth read column signals;
wherein the write column signal includes first, second, third, and fourth write column signals; and
wherein the column control circuit comprises:
a bank control circuit configured to generate first, second, third, and fourth read latch address signals or first, second, third, and fourth internal read latch address signals from the first, second, third, and fourth read bank address signals in response to the first and second read latch pulses and configured to generate first, second, third, and fourth write latch address signals or first, second, third, and fourth internal write latch address signals from the first, second, third, and fourth write bank address signals in response to the first and second write latch pulses;
a signal synthesis circuit configured to generate a read synthesis signal by synthesizing first and second read pulses, which are sequentially enabled during the internal read operation and configured to generate a write synthesis signal by synthesizing first and second write pulses, which are sequentially enabled during the write operation; and
a column signal generation circuit configured to output the first, second, third, and fourth read latch address signals or the first, second, third, and fourth internal read latch address signals as the first, second, third, and fourth read column signals in response to the read synthesis signal and configured to output the first, second, third, and fourth write latch address signals or the first, second, third, and fourth internal write latch address signals as the first, second, third, and fourth write column signals in response to the write synthesis signal.

6. The semiconductor device of claim 5, wherein the bank control circuit comprises:
a first bank control circuit configured to generate the first read latch address signal or the first internal read latch address signal from the first read bank address signal in response to the first and second read latch pulses and configured to generate the first write latch address signal or the first internal write latch address signal from the first write bank address signal in response to the first and second write latch pulses;
a second bank control circuit configured to generate the second read latch address signal or the second internal read latch address signal from the second read bank address signal in response to the first and second read latch pulses and configured to generate the second write latch address signal or the second internal write latch address signal from the second write bank address signal in response to the first and second write latch pulses;

a third bank control circuit configured to generate the third read latch address signal or the third internal read latch address signal from the third read bank address signal in response to the first and second read latch pulses and configured to generate the third write latch address signal or the third internal write latch address signal from the third write bank address signal in response to the first and second write latch pulses; and a fourth bank control circuit configured to generate the fourth read latch address signal or the fourth internal read latch address signal from the fourth read bank address signal in response to the first and second read latch pulses and configured to generate the fourth write latch address signal or the fourth internal write latch address signal from the fourth write bank address signal in response to the first and second write latch pulses.

7. The semiconductor device of claim 5, wherein the signal synthesis circuit comprises:

a first synthesis circuit configured to generate the read synthesis signal, which is enabled when any one of the first and second read pulses is inputted to the first synthesis circuit; and a second synthesis circuit configured to generate the write synthesis signal, which is enabled when any one of the first and second write pulses is inputted to the second synthesis circuit.

8. The semiconductor device of claim 5, wherein the column signal generation circuit comprises:

a first column signal generation circuit configured to output the first read latch address signal and the first internal read latch address signal as the first read column signal in response to the read synthesis signal, configured to output the first write latch address signal and the first internal write latch address signal as the first write column signal in response to the write synthesis signal, and configured to interrupt input of the first write latch address signal and the first internal write latch address signal in response to a write/read control signal;

a second column signal generation circuit configured to output the second read latch address signal and the second internal read latch address signal as the second read column signal in response to the read synthesis signal, configured to output the second write latch address signal and the second internal write latch address signal as the second write column signal in response to the write synthesis signal, and configured to interrupt input of the second write latch address signal and the second internal write latch address signal in response to the write/read control signal;

a third column signal generation circuit configured to output the third read latch address signal and the third internal read latch address signal as the third read column signal in response to the read synthesis signal, configured to output the third write latch address signal and the third internal write latch address signal as the third write column signal in response to the write synthesis signal, and configured to interrupt input of the third write latch address signal and the third internal write latch address signal in response to the write/read control signal; and a fourth column signal generation circuit configured to output the fourth read latch address signal and the fourth internal read latch address signal as the fourth read column signal in response to the read synthesis signal, configured to output the fourth write latch address signal and the fourth internal write latch address signal as the fourth write column signal in response to the write synthesis signal, and configured to interrupt input of the fourth write latch address signal and the fourth internal write latch address signal in response to the write/read control signal.

9. The semiconductor device of claim 1, further comprising:

a read/write control circuit configured to generate a read control signal and a write control signal, which are sequentially enabled in response to a masked write signal enabled during the masked write operation and configured to generate a read pulse and a write pulse, which are sequentially enabled in response to the masked write signal;

a latch pulse generation circuit configured to latch and delay the read pulse by a predetermined period to generate the read latch pulse and configured to latch and delay the write pulse by the predetermined period to generate the write latch pulse; and a bank address generation circuit configured to generate the read bank address signal from a command/address signal in response to the read control signal and configured to generate the write bank address signal from the command/address signal in response to the write control signal.

10. The semiconductor device of claim 9, wherein the command/address signal includes first, second, third, and fourth command/address signals;

wherein the read bank address signal includes first, second, third, and fourth read bank address signals;

wherein the write bank address signal includes first, second, third, and fourth write bank address signals; and wherein the bank address generation circuit comprises:

a read bank address generation circuit configured to generate the first, second, third, and fourth read bank address signals from the first, second, third, and fourth command/address signals in response to the read control signal; and a write bank address generation circuit configured to generate the first, second, third, and fourth write bank address signals from the first, second, third, and fourth command/address signals in response to the write control signal.

11. The semiconductor device of claim 10, wherein the read bank address generation circuit comprises:

a first counter configured to generate first, second, third, and fourth read input signals and first, second, third, and fourth read output signals, which are sequentially counted in response to the read control signal; and a first pipe circuit configured to latch the first, second, third, and fourth command/address signals in response to the first, second, third, and fourth read input signals and configured to output the latched signals of the first, second, third, and fourth command/address signals as the first, second, third, and fourth read bank address signals in response to the first, second, third, and fourth read output signals.

12. The semiconductor device of claim 10, wherein the write bank address generation circuit comprises:

a second counter configured to generate first, second, third, and fourth write input signals and first, second, third, and fourth write output signals, which are sequentially counted in response to the write control signal; and a second pipe circuit configured to latch the first, second, third, and fourth command/address signals in response to the first, second, third, and fourth write input signals and configured to output the latched signals of the first, second, third, and fourth command/address signals as the first, second, third, and fourth write bank address signals in response to the first, second, third, and fourth write output signals.

13. A semiconductor device comprising:
a bank control circuit configured to generate first and second read latch address signals or first and second internal read latch address signals from first and second read bank address signals in response to first and second read latch pulses and configured to generate first and second write latch address signals or first and second internal write latch address signals from first and second write bank address signals in response to first and second write latch pulses;
a signal synthesis circuit configured to generate a read synthesis signal by synthesizing first and second read pulses, which are sequentially enabled during an internal read operation of a masked write operation and configured to generate a write synthesis signal by synthesizing first and second write pulses, which are sequentially enabled during a write operation of the masked write operation; and
a column signal generation circuit configured to output the first and second read latch address signals or the first and second internal read latch address signals as first and second read column signals in response to the read synthesis signal and configured to output the first and second write latch address signals or the first and second internal write latch address signals as first and second write column signals in response to the write synthesis signal.

14. The semiconductor device of claim 13, wherein the bank control circuit comprises:
a first bank control circuit configured to generate the first read latch address signal or the first internal read latch address signal from the first read bank address signal in response to the first and second read latch pulses and configured to generate the first write latch address signal or the first internal write latch address signal from the first write bank address signal in response to the first and second write latch pulses; and
a second bank control circuit configured to generate the second read latch address signal or the second internal read latch address signal from the second read bank address signal in response to the first and second read latch pulses and configured to generate the second write latch address signal or the second internal write latch address signal from the second write bank address signal in response to the first and second write latch pulses.

15. The semiconductor device of claim 14, wherein the first bank control circuit comprises:
a first pulse generation circuit configured to generate the first read latch address signal from the first read bank address signal in response to the first read latch pulse;
a second pulse generation circuit configured to generate the first internal read latch address signal from the first read bank address signal in response to the second read latch pulse;
a third pulse generation circuit configured to generate the first write latch address signal from the first write bank address signal in response to the first write latch pulse; and a fourth pulse generation circuit configured to generate the first internal write latch address signal from the first write bank address signal in response to the second write latch pulse.

16. The semiconductor device of claim 14, wherein the second bank control circuit comprises:
a fifth pulse generation circuit configured to generate the second read latch address signal from the second read bank address signal in response to the first read latch pulse;
a sixth pulse generation circuit configured to generate the second internal read latch address signal from the second read bank address signal in response to the second read latch pulse;
a seventh pulse generation circuit configured to generate the second write latch address signal from the second write bank address signal in response to the first write latch pulse; and
an eighth pulse generation circuit configured to generate the second internal write latch address signal from the second write bank address signal in response to the second write latch pulse.

17. The semiconductor device of claim 13, wherein the signal synthesis circuit comprises:
a first synthesis circuit configured to generate the read synthesis signal, which is enabled when any one of the first and second read pulses is inputted to the first synthesis circuit; and
a second synthesis circuit configured to generate the write synthesis signal, which is enabled when any one of the first and second write pulses is inputted to the second synthesis circuit.

18. The semiconductor device of claim 13, wherein the column signal generation circuit comprises:
a first column signal generation circuit configured to output the first read latch address signal and the first internal read latch address signal as the first read column signal in response to the read synthesis signal, configured to output the first write latch address signal and the first internal write latch address signal as the first write column signal in response to the write synthesis signal, and configured to interrupt input of the first write latch address signal and the first internal write latch address signal in response to a write/read control signal; and
a second column signal generation circuit configured to output the second read latch address signal and the second internal read latch address signal as the second read column signal in response to the read synthesis signal, configured to output the second write latch address signal and the second internal write latch address signal as the second write column signal in response to the write synthesis signal, and configured to interrupt input of the second write latch address signal and the second internal write latch address signal in response to the write/read control signal.

19. The semiconductor device of claim 18, wherein the first column signal generation circuit comprises:
a first control signal generation circuit configured to generate a first control signal which is enabled in response to the first read latch address signal and the first internal read latch address signal, configured to generate the first control signal from the first write latch address signal and the first internal write latch address signal in response to the write/read control signal or to interrupt input of the first write latch address signal and the first internal write latch address signal in response to the write/read control signal, and configured to generate a second control signal from the first write latch address signal and the first internal write latch address signal;

a first internal read signal generation circuit configured to latch the read synthesis signal to generate a first internal read signal in response to the first control signal;

a first internal write signal generation circuit configured to latch the write synthesis signal to generate a first internal write signal in response to the second control signal; and a first selection/transmission circuit configured to output the first internal read signal as the first read column signal or to output the first internal write signal as the first write column signal in response to a flag signal which is enabled during the internal read operation.

20. The semiconductor device of claim 18, wherein the second column signal generation circuit comprises:

a second control signal generation circuit configured to generate a third control signal which is enabled in response to the second read latch address signal and the second internal read latch address signal, configured to generate the third control signal from the second write latch address signal and the second internal write latch address signal in response to the write/read control signal or to interrupt input of the second write latch address signal and the second internal write latch address signal in response to the write/read control signal, and configured to generate a fourth control signal from the second write latch address signal and the second internal write latch address signal;

a second internal read signal generation circuit configured to latch the read synthesis signal to generate a second internal read signal in response to the third control signal;

a second internal write signal generation circuit configured to latch the write synthesis signal to generate a second internal write signal in response to the fourth control signal; and a second selection/transmission circuit configured to output the second internal read signal as the second read column signal or to output the second internal write signal as the second write column signal in response to a flag signal which is enabled during the internal read operation.

* * * * *